US011925046B2

(12) United States Patent
Adachi et al.

(10) Patent No.: US 11,925,046 B2
(45) Date of Patent: Mar. 5, 2024

(54) LIGHT-EMITTING DEVICE, LIGHT-EMITTING METHOD, AND ORGANIC LIGHT-EMITTING ELEMENT

(71) Applicants: KYUSHU UNIVERSITY, NATIONAL UNIVERSITY CORPORATION, Fukuoka (JP); HAMAMATSU PHOTONICS K.K., Hamamatsu (JP)

(72) Inventors: Chihaya Adachi, Fukuoka (JP); Hajime Nakanotani, Fukuoka (JP); Takahiko Yamanaka, Hamamatsu (JP); Shigeo Hara, Hamamatsu (JP); Toru Hirohata, Hamamatsu (JP)

(73) Assignees: KYUSHU UNIVERSITY, NATIONAL UNIVERSITY CORPORATION, Fukuoka (JP); HAMAMATSU PHOTONICS K.K., Hamamatsu (JP)

( * ) Notice: Subject to any disclaimer, the term of this patent is extended or adjusted under 35 U.S.C. 154(b) by 81 days.

(21) Appl. No.: 16/942,283

(22) Filed: Jul. 29, 2020

(65) Prior Publication Data
US 2021/0036256 A1    Feb. 4, 2021

(30) Foreign Application Priority Data

Aug. 2, 2019  (JP) ................................. 2019-142844
Jun. 4, 2020  (JP) ................................. 2020-097798

(51) Int. Cl.
*H10K 50/18*    (2023.01)
*H10K 50/11*    (2023.01)
(Continued)

(52) U.S. Cl.
CPC ............. *H10K 50/18* (2023.02); *H10K 50/11* (2023.02); *H10K 71/00* (2023.02); *H10K 2101/40* (2023.02)

(58) Field of Classification Search
CPC ............. H01L 51/5004; H01L 51/5096; H01L 51/5012; H01L 27/3211; H01L 51/006;
(Continued)

(56) References Cited

U.S. PATENT DOCUMENTS 6,210,814 B1    4/2001  Thompson et al.
2007/0125419 A1*  6/2007  Gui ...................... H10K 30/151
                                                                              136/252

(Continued)

FOREIGN PATENT DOCUMENTS

JP            3303470 B2    7/2002
JP         2004/054269 A    2/2004
JP         2005/502086 A    1/2005
JP         2005/510025 A    4/2005

*Primary Examiner* — Mohammad A Rahman
(74) *Attorney, Agent, or Firm* — Faegre Drinker Biddle & Reath LLP

(57) ABSTRACT

Provided is a light-emitting device including an organic light-emitting element and a control unit that controls the organic light-emitting element. The organic light-emitting element includes a first electrode, a second electrode, and an organic light-emitting layer which is disposed between the first electrode and the second electrode and in which separation of charges occurs due to incidence of excited light. The control unit changes a potential difference between the first electrode and the second electrode so that recoupling of the charges occurs, in a second period after passage of a delay period from a first period in which the excited light is incident to the organic light-emitting layer.

7 Claims, 17 Drawing Sheets

(51) Int. Cl.
  *H10K 71/00* (2023.01)
  *H10K 101/40* (2023.01)

(58) Field of Classification Search
  CPC ............. H01L 51/5016; H01L 51/5056; H01L 51/0058; H01L 2251/552; H01L 2251/558; H01L 2251/556; H01L 51/5048–5084; H01L 51/5072–5084; H01L 51/5092; H01L 51/0084–0092; H01L 51/56; H01L 51/5068; H01L 51/52; G11C 13/047; G09G 1/07; G09G 1/165; G09G 3/06; G09G 3/16; G09G 3/207; G09G 3/2077; G09G 3/2088; G09G 3/22; G09G 3/3233; G09G 3/3258; G09G 3/34; G09G 3/3406; G09G 3/3413; G09G 3/342; H10K 50/18; H10K 50/11; H10K 71/00; H10K 2101/40; H10K 50/157; H10K 50/167; H10K 50/80
  See application file for complete search history.

(56) References Cited

U.S. PATENT DOCUMENTS

| | | | | |
|---|---|---|---|---|
| 2009/0302313 | A1* | 12/2009 | Choi | H10K 50/12 438/45 |
| 2010/0285599 | A1* | 11/2010 | Schliesser | G01N 21/6428 422/69 |
| 2015/0349273 | A1* | 12/2015 | Hung | C07D 403/10 544/212 |
| 2016/0035993 | A1 | 2/2016 | Yang et al. | |
| 2016/0141506 | A1* | 5/2016 | Miyashita | C09B 57/00 585/27 |
| 2017/0033301 | A1* | 2/2017 | Han | H10K 85/342 |
| 2017/0110517 | A1* | 4/2017 | Wada | H10K 85/631 |
| 2017/0269762 | A1* | 9/2017 | Xu | G06F 3/0412 |
| 2018/0122869 | A1* | 5/2018 | Jiang | G02F 1/133617 |
| 2021/0210708 | A1* | 7/2021 | Ganier | H10K 85/30 |
| 2021/0280811 | A1* | 9/2021 | Ohsawa | H10K 85/342 |
| 2021/0351370 | A1* | 11/2021 | Zhang | H10K 50/18 |
| 2022/0199926 | A1* | 6/2022 | Kobashi | C09K 11/883 |

* cited by examiner

LIGHT-EMITTING DEVICE, LIGHT-EMITTING METHOD, AND ORGANIC LIGHT-EMITTING ELEMENT

TECHNICAL FIELD

The present disclosure relates to a light-emitting device, a light-emitting method, and an organic light-emitting element.

BACKGROUND

Japanese Patent No. 3303470 discloses a fluorescent device including an organic dye thin film, a pair of electrodes disposed to apply a voltage to the organic dye thin film, and a light source that excites the organic dye thin film to generate fluorescence. The fluorescent device described in Japanese Patent No. 3303470 changes the amount of charges in the organic dye thin film by changing a voltage applied to the pair of electrodes, thereby increasing or decreasing efficiency of fluorescence.

SUMMARY

Various possibilities are expected for an organic light-emitting layer. Here, the present inventors have made a thorough investigation on an unknown light-emitting form, and they have accomplished a light-emitting device, a light-emitting method, and an organic light-emitting element according to the present disclosure.

An object of the present disclosure is to provide a light-emitting device, a light-emitting method, and an organic light-emitting element which are capable of realizing a new light-emitting form.

According to an aspect of the present disclosure, there is provided a light-emitting device including an organic light-emitting element and a control unit that controls the organic light-emitting element. The organic light-emitting element includes a first electrode, a second electrode, and an organic light-emitting layer which is disposed between the first electrode and the second electrode and in which separation of charges occurs due to incidence of excited light. The control unit changes a potential difference between the first electrode and the second electrode so that recoupling of the charges occurs, in a second period after passage of a delay period from a first period in which the excited light is incident to the organic light-emitting layer.

DETAILED DESCRIPTION

Figure 1:
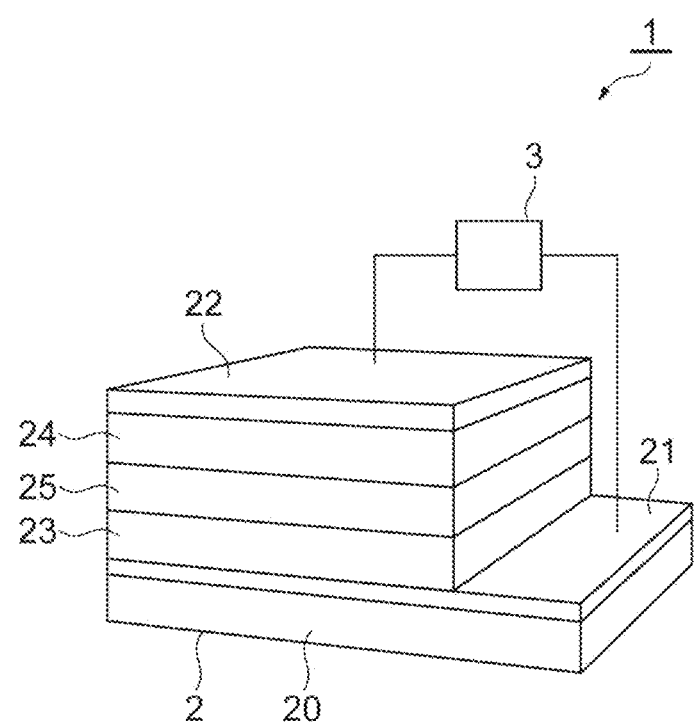
FIG. 1 is a configuration diagram of a light-emitting device according to an embodiment.

Hereinafter, embodiments of the present disclosure will be described in detail with reference to the accompanying drawings. Note that, in the respective drawings, the same reference numeral will be given to the same or equivalent portions, and redundant description thereof will be omitted.

[Configuration of Light-Emitting Device]

As illustrated in FIG. 1, a light-emitting device 1 includes an organic light-emitting element 2 and a control unit 3. The organic light-emitting element 2 includes a light-transmitting substrate 20, a first electrode 21, a second electrode 22, a first charge inflow blocking layer (charge inflow blocking layer) 23, a second charge inflow blocking layer (charge inflow blocking layer) 24, and an organic light-emitting layer 25. In the organic light-emitting element 2, the first electrode 21, the first charge inflow blocking layer 23, the organic light-emitting layer 25, the second charge inflow blocking layer 24, and the second electrode 22 are stacked on the light-transmitting substrate 20 in this order. That is, in the organic light-emitting element 2, the second electrode 22 is disposed to face the first electrode 21, and the organic light-emitting layer 25 is disposed between the first electrode 21 and the second electrode 22. In addition, in the organic light-emitting element 2, the first charge inflow blocking layer 23 is disposed between the first electrode 21 and the organic light-emitting layer 25, and the second charge inflow blocking layer 24 is disposed between the second electrode 22 and the organic light-emitting layer 25.

The light-transmitting substrate 20 is a substrate formed from a material having a light-transmitting property (for example, glass or the like). The first electrode 21 is a layer formed from a material having a conductive property and a light-transmitting property (for example, ITO or the like). The light-transmitting substrate 20 and the first electrode 21 have a light-transmitting property with respect to excited light that is incident to the organic light-emitting layer 25 from the outside, and light (details thereof will be described later) that is emitted from the organic light-emitting layer 25 to the outside. The second electrode 22 is a layer formed from a material having a conductive property (for example, aluminum or the like). In this embodiment, a work function (a depth (absolute value) from a vacuum level) of the second electrode 22 is smaller than a work function of the first electrode 21. For example, in a case where the first electrode 21 is formed from ITO, and the second electrode 22 is formed from aluminum, the work function of the first electrode 21 is approximately 4.8 eV, and the work function of the second electrode 22 is 4.2 eV.

The first charge inflow blocking layer 23 is a layer that blocks inflow of charges from the first electrode 21 to the organic light-emitting layer 25. As in the light-transmitting substrate 20 and the first electrode 21, the first charge inflow blocking layer 23 has a light-transmitting property with respect to excited light that is incident to the organic light-emitting layer 25 from the outside, and light (details thereof will be described later) that is emitted from the organic light-emitting layer 25 to the outside. The second charge inflow blocking layer 24 is a layer that blocks inflow of charges from the second electrode 22 to the organic light-emitting layer 25. As an example, in a case where the first charge inflow blocking layer 23 is formed from a so-called electron transfer material (for example, T2T, BCP, TPBi, Bphen, or the like), inflow of holes from the first electrode 21 to the organic light-emitting layer 25 is blocked due to the first charge inflow blocking layer 23. In addition, in a case where the second charge inflow blocking layer 24 is formed from a so-called hole transfer material (for example, CBP, TAPC, Tris-PCz, NPD, or the like), inflow of electrons from the second electrode 22 to the organic light-emitting layer 25 is blocked due to the second charge inflow blocking layer 24.

The organic light-emitting layer 25 is a layer in which separation of charges occurs due to incidence of excited light. In this embodiment, the organic light-emitting layer 25 is constituted by a host material including organic light emitters in which separation of charges occurs due to incidence of excited light. In the organic light-emitting layer 25, as the organic light emitters in which separation of charges occurs due to incidence of excited light, for example, TPA-DCPP, 4CzIPN, Alq3, TBRb, 4CzTPN-Ph, or the like is used. In the organic light-emitting layer 25, as the host material, for example, CBP, mCBP, T2T, mCP, PPT, DPEPO, or the like is used. It is preferable that the host material has excitation triplet energy larger than that of the organic light emitters.

The control unit 3 controls the organic light-emitting element 2. Specifically, the control unit 3 controls a value of a voltage that is applied between the first electrode 21 and the second electrode 22, timing at which the voltage is applied between the first electrode 21 and the second electrode 22, or the like. The control unit 3 can adjust a length of a delay period to be described later. As an example, the control unit 3 is constituted by an integrated circuit such as a function generator (an arbitrary waveform output device) and FPGA.

[Light-Emitting Method Carried Out in Light-Emitting Device]

A light-emitting method that is carried out in the light-emitting device 1 (that is, a light-emitting method using the organic light-emitting element 2) will be described with reference to FIGS. 2A to 2C, FIG. 3, and FIGS. 4A and 4B. Note that, in FIGS. 2A to 2C, the light-transmitting substrate 20 is not illustrated in the organic light-emitting element 2. In addition, as an example, FIG. 3 and FIGS. 4A and 4B illustrates an energy diagram in a case where the first electrode 21 is formed from ITO, the second electrode 22 is formed from aluminum, the first charge inflow blocking layer 23 is formed from T2T, the second charge inflow blocking layer 24 is formed from CBP, and the organic light-emitting layer 25 is formed from TPA-DCPP (organic light emitters) and CBP (host material).

Figure 2A:
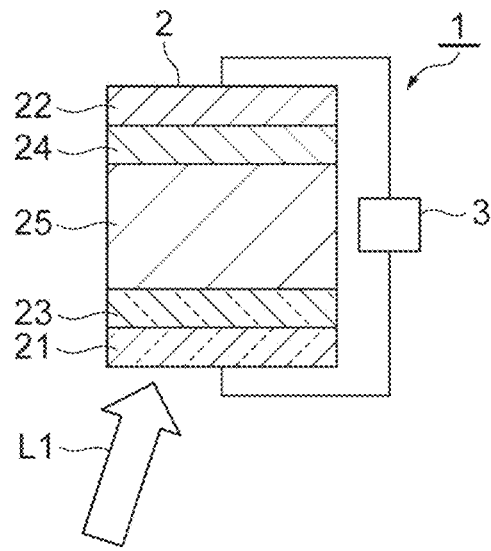
FIGS. 2A to 2C are schematic diagrams of an organic light-emitting element illustrated in FIG. 1.
Figure 3:
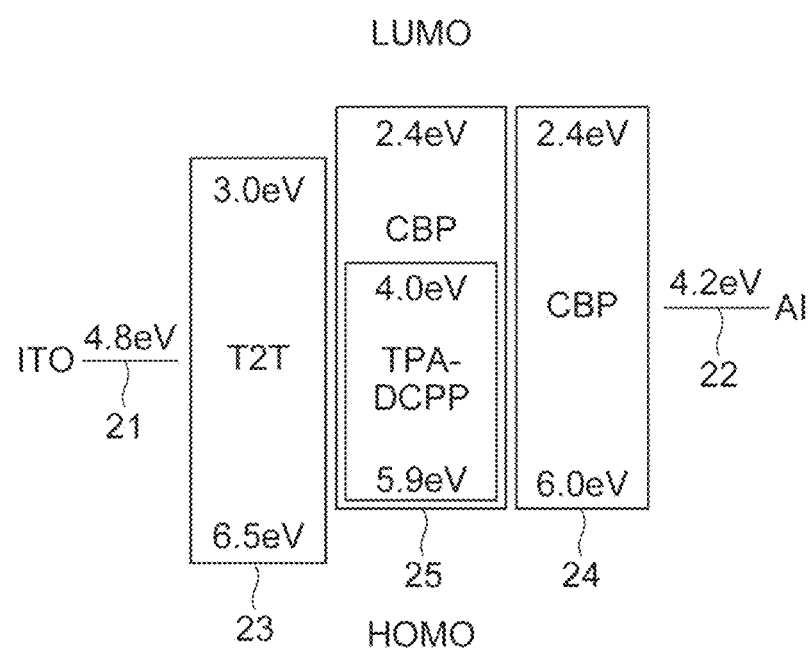
FIG. 3 is an energy diagram of the organic light-emitting element illustrated in FIG. 1.
Figure 4A:
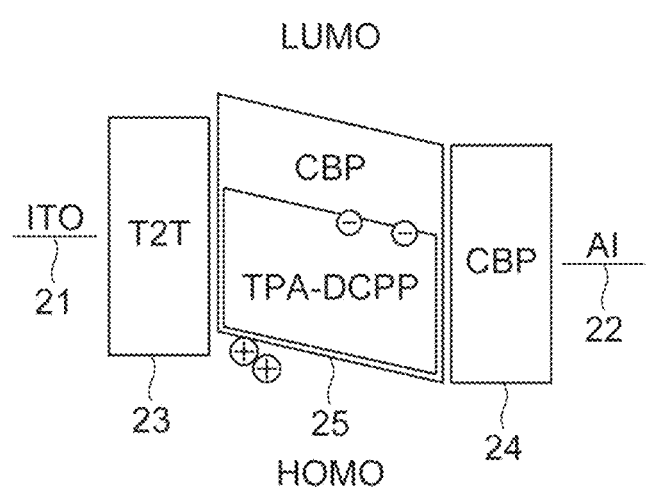
FIGS. 4A and 4B are energy diagrams of the organic light-emitting element illustrated in FIG. 1.
Figure 4B:
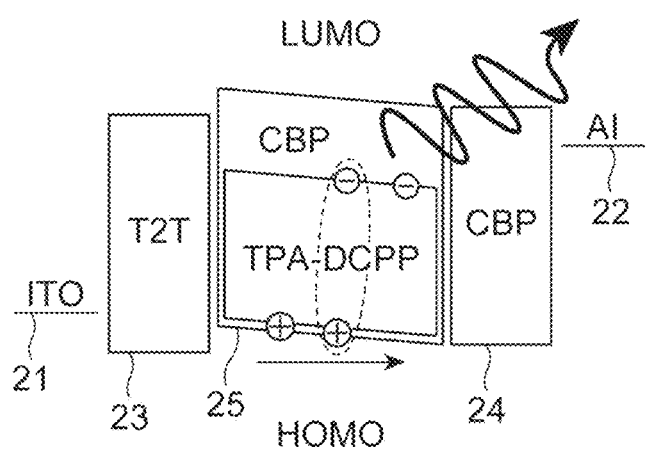

First, in a normal state, as illustrated in FIG. 3, separation of charges does not occur in the organic light-emitting layer 25, and holes and electrodes which are generated due to separation of charges do not exist in the organic light-emitting layer 25. In this state, as illustrated in FIG. 2A, when excited light L1 is incident to the organic light-emitting layer 25 through the light-transmitting substrate 20 (refer to FIG. 1), the first electrode 21, and the first charge inflow blocking layer 23 from the outside in a first period (step in which excited light is incident), separation of charges occurs in the organic light-emitting layer 25, and holes and electrodes are generated.

Figure 2B:
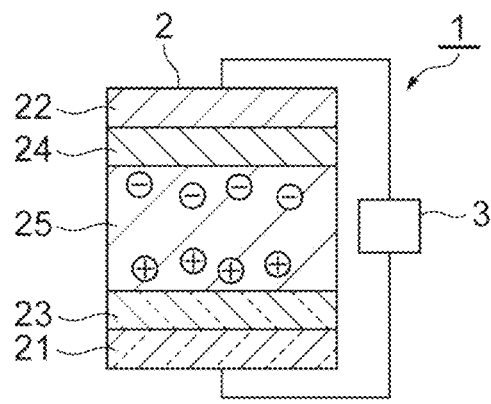

More specifically, molecules of TPA-DCPP in the organic light-emitting layer 25 enters an excited state due to incidence of the excited light L1, and some of the molecules in the excited state emit light and return to a ground state, but the remaining molecules do not emit light and separation of charges occurs. As illustrated in FIG. 2B and FIG. 4A, holes generated due to separation of charges move to an interface between the organic light-emitting layer 25 and the first charge inflow blocking layer 23. Electrons generated due to separation of charges are trapped in TPA-DCPP in the organic light-emitting layer 25.

Figure 2C:
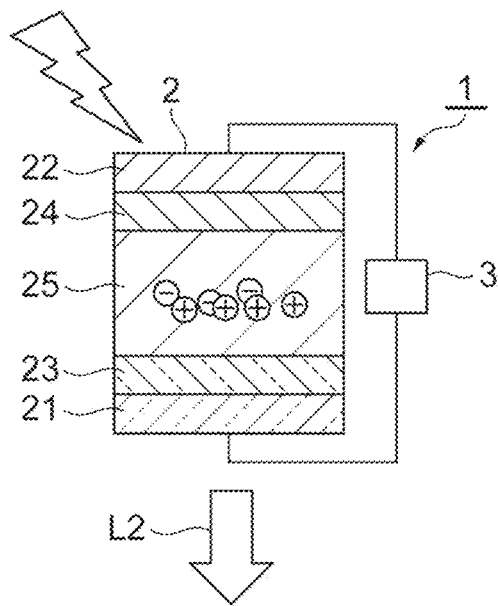

Continuously, the control unit 3 changes a potential difference between the first electrode 21 and the second electrode 22 so that recoupling of charges occurs in a second period after passage of a delay period from the first period (step of changing a potential difference). According to this, as illustrated in FIG. 2C and FIG. 4B, holes and electrodes are recoupled in the organic light-emitting layer 25, and thus light L2 is emitted from the organic light-emitting layer 25 to the outside through the first charge inflow blocking layer 23, the first electrode 21, and the light-transmitting substrate 20 (refer to FIG. 1). Here, the delay period is a period from termination of the first period to initiation of the second period.

Note that, the control unit 3 sets a potential difference between the first electrode 21 and the second electrode 22 to 0 in the first period and the delay period, and applies a voltage between the first electrode 21 and the second electrode 22 so that an electric field in a forward direction (hereinafter, simply referred to as "forward electric field") which causes recoupling of charges occurs in the organic light-emitting layer 25 (so that a potential of the first electrode 21 becomes positive with a potential of the second electrode 22 set as a reference in an example illustrated in FIG. 3) in the second period. Alternatively, the control unit 3 applies a voltage between the first electrode 21 and the second electrode 22 so that an electric field in a direction opposite to the forward electric field (hereinafter, simply referred to as "reverse electric field") occurs in the organic light-emitting layer 25 (so that the potential of the first electrode 21 becomes negative with the potential of the second electrode 22 set as a reference in the example illustrated in FIG. 3) in the first period and the delay period, and applies a voltage between the first electrode 21 and the second electrode 22 so that a forward electric field occurs in the organic light-emitting layer 25 (so that the potential of the first electrode 21 becomes positive with the potential of the second electrode 22 set as a reference in the example illustrated in FIG. 3) in the second period.

[Operation and Effect]

In the light-emitting device 1, the organic light-emitting layer 25 in which separation of charges occurs due to incidence of the excited light L1 is used, and the potential difference between the first electrode 21 and the second electrode 22 is changed so that recoupling of charges occurs in the second period after passage of the delay period from the first period in which the excited light L1 is incident to the organic light-emitting layer 25. According to this, light emission (emission of light L2) from the organic light-emitting layer 25 can be obtained in the second period after passage of the delay period from the first period in which the excited light L1 is incident to the organic light-emitting layer 25. In this manner, according to the light-emitting device 1 (and a light-emitting method using the organic light-emitting element 2), a new light-emitting form can be realized. The light-emitting form by the light-emitting device 1 (and the light-emitting method using the organic light-emitting element 2) is expected to be applied to an optical storage device or the like that stores a light irradiation history.

In addition, in the light-emitting device 1, the control unit 3 sets the potential difference between the first electrode 21 and the second electrode 22 to 0 in the first period and the delay period, and applies a voltage between the first electrode 21 and the second electrode 22 so that the forward electric field occurs in the organic light-emitting layer 25 in the second period. Alternatively, in the light-emitting device 1, the control unit 3 applies a voltage between the first electrode 21 and the second electrode 22 so that the reverse electric field occurs in the organic light-emitting layer 25 in the first period and the delay period, and applies a voltage between the first electrode 21 and the second electrode 22 so that the forward electric field occurs in the organic light-emitting layer 25 in the second period. Even in any case, light emission can be obtained from the organic light-emitting layer 25 in the second period with a simple voltage application method.

In addition, in the light-emitting device 1, the control unit 3 can adjust the length of the delay period. According to this, it is possible to adjust timing at which the light L2 is emitted from the organic light-emitting layer 25 to the outside.

In addition, in the organic light-emitting element 2, when separation of charges occurs in the organic light-emitting layer 25 due to incidence of the excited light L1, reduction of separated charges due to inflow of charges from each of the first electrode 21 and the second electrode 22 to the organic light-emitting layer 25 is suppressed by the first charge inflow blocking layer 23 and the second charge inflow blocking layer 24. Accordingly, when a potential difference between the first electrode 21 and the second electrode 22 is changed so that recoupling of charges occurs in the second period after passage of the delay period from the first period in which the excited light L1 is incident to the organic light-emitting layer 25, light emission from the organic light-emitting layer 25 can be obtained in the second period. In this manner, according to the organic light-emitting element 2, a new light-emitting form can be realized. The light-emitting form by the organic light-emitting element 2 is expected to be applied to an optical storage device or the like that stores a light irradiation history.

In addition, in the organic light-emitting element 2, the first electrode 21 and the first charge inflow blocking layer 23 have light-transmitting property with respect to the excited light L1 incident to the organic light-emitting layer 25, and the light L2 emitted from the organic light-emitting layer 25. According to this, the excited light L1 can be reliably incident to the organic light-emitting layer 25, and the light L2 can be reliably emitted from the organic light-emitting layer 25.

[Consideration on Charge Inflow Blocking Layer]

In the case of applying a voltage between the first electrode 21 and the second electrode 22 so that the potential of the first electrode 21 becomes positive with the potential of the second electrode 22 set as a reference in the second period in order for the forward electric field to occur in the organic light-emitting layer 25, the case corresponds to a case where the first electrode 21 is caused to function as a positive electrode and the second electrode 22 is caused to function as a negative electrode. Accordingly, in such a case, typically, a material of the first electrode 21 and a material of the second electrode 22 are selected so that a work function of the second electrode 22 becomes smaller than a work function of the first electrode 21.

Here, to prevent inflow of charges from the first electrode 21 to the organic light-emitting layer 25 in the first period and the delay period, basically, it is necessary to select a material with which an injection barrier with respect to the work function of the first electrode 21 increases as a material of the first charge inflow blocking layer 23. Similarly, to prevent inflow of charges from the second electrode 22 to the organic light-emitting layer 25, basically, it is necessary to select a material with which an injection barrier with respect to the work function of the second electrode 22 increases as a material of the second charge inflow blocking layer 24.

In the example illustrated in FIG. 3, since the work function of the first electrode 21 formed from ITO is approximately 4.8 eV, T2T (HOMO level: 6.5 eV) in which a hole injection barrier is high (that is, HOMO level is deep) is selected as a material of the first charge inflow blocking layer 23. In addition, since T2T is an electron transfer material having high electron mobility, high resistance can be maintained with respect to inflowing holes. Note that, in the case of applying a voltage between the first electrode 21 and the second electrode 22 so that the potential of the first electrode 21 becomes negative with the potential of the second electrode 22 set as a reference in order for a reverse electric field to occur in the organic light-emitting layer 25 in the first period and the delay period, electrons are apt to flow in from the first electrode 21. However, since the work function of the first electrode 21 that functions as a positive electrode is large in the second period, and thus the organic light emitters essentially has characteristics in which electrons are less likely to be injected. Therefore, it is not necessary to limit conditions of the material of the first charge inflow blocking layer 23 in consideration of the case.

In addition, in the example illustrated in FIG. 3, since the work function of the second electrode 22 formed from aluminum is 4.2 eV, CBP (LUMO level: 2.4 eV) in which an electron injection barrier is high (that is, a LUMO level is shallow) is selected as the material of the second charge inflow blocking layer 24. Note that, in the case of applying a voltage between the first electrode 21 and the second electrode 22 so that the potential of the first electrode 21 becomes negative with the potential of the second electrode 22 set as a reference in the first period and the delay period in order for an reverse electric field to occur in the organic light-emitting layer 25, there is a possibility that holes may flow in from the second electrode 22. Accordingly, in consideration of the case, a material in which a hole injection barrier is high (that is, the HOMO lever is deep) may be selected as the material of the second charge inflow blocking layer 24.

In addition, in the case of selecting the material of the first charge inflow blocking layer 23 and the material of the second charge inflow blocking layer 24, focus may be given to current density-voltage (J-V) characteristics. In both the case of applying a voltage between the first electrode 21 and the second electrode 22 so that the potential of the first electrode 21 becomes +10 V with the potential of the second electrode 22 set as a reference and the case of applying a voltage between the first electrode 21 and the second electrode 22 so that the potential of the first electrode 21 becomes −10 V with the potential of the second electrode 22 set as a reference, the material of the first charge inflow blocking layer 23 and the material of the second charge inflow blocking layer 24 may be selected so that current density in the organic light-emitting layer 25 becomes less than 0.1 mA/cm². Note that, as the current density in this case, a value (the number of times of averaging is 2 or greater) obtained by measuring current density in the case of applying +10 V to −10 V in a dark state with a source meter 2400 series manufactured by KEITHLEY INSTRUMENTS, INC. can be used.

In addition, a material having a HOMO level deeper than the HOMO level of the organic light emitters of the organic light-emitting layer 25 may be selected as the material of the first charge inflow blocking layer 23 so as to prevent flowing-out of holes from the organic light-emitting layer 25 to the first electrode 21 in the first period and the delay period. In addition, a material having a LUMO level shallower than the LUMO level of the organic light emitters of the organic light-emitting layer 25 may be selected as the material of the second charge inflow blocking layer 24 so as to prevent flowing-out of electrons from the organic light-emitting layer 25 to the second electrode 22 in the first period and the delay period. According to these, light emission from the organic light-emitting layer 25 in the second period can be obtained in a more reliable manner Note that, in a case where at least one of the material of the first charge inflow blocking layer 23 and the material of the second charge inflow blocking layer 24 has a HOMO level deeper than the HOMO level of the organic light emitters of the organic light-emitting layer 25, flowing-out of holes from the organic light-emitting layer 25 to the outside can be prevented in the first period and the delay period. Alternatively, in a case where at least one of the material of the first charge inflow blocking layer 23 and the material of the second charge inflow blocking layer 24 has a LUMO level shallower than the LUMO level of the organic light emitters of the organic light-emitting layer 25, flowing-out of electrons from the organic light-emitting layer 25 to the outside can be prevented in the first period and the delay period. Even in these cases, light emission from the organic light-emitting layer 25 in the second period can be obtained in a more reliable manner.

In this specification, the HOMO level and the LUMO level of the organic light emitters and the charge inflow blocking layer can be measured by the following method.

The organic light emitters or the charge inflow blocking layer is independently formed in a film shape on an As-doped n-type bear Si wafer that is subjected to surface mirror finishing, has resistivity of 0.0030 to 0.0060 Ω·cm, and has a crystal orientation of <100>, and the HOMO level is measured by a photoemission yield spectroscopy in air AC-3E (manufactured by RIKEN KEIKI Co., Ltd.). It is preferable that the film thickness is set to 100 nm. However, in the case of forming a film by a spin coating method, it is difficult to form a thick film, and thus measurement is performed in a thickness of approximately 30 nm.

The organic light emitting emitters or the charge inflow blocking layer is independently formed in a film shape on a quartz substrate, and an absorption spectrum is measured by UV-VIS-NIR spectrophotometer LAMBDA950 (manufactured by PerkinElmer, Inc.). At this time, a film thickness is adjusted so that an absorption peak on the longest wavelength side becomes an optical density (OD) of 0.1 to 1.0. In addition, with regard to the light emitters, an absorption maximum value on the longest wavelength side is set as $P_{Abs}$. With regard to the LUMO level, a wavelength is set to a wavelength $\lambda_{edge}$ [nm] of an intersection of a tangential line drawn to the falling on a long wavelength side and the horizontal axis (wavelength axis) in a peak on the longest wavelength side of an absorption spectrum that is obtained, and the LUMO level is obtained by an equation of LUMO [eV]=HOMO+(1240/$\lambda_{edge}$) by using the value of HOMO [eV] obtained by above-described method. Note that, the tangential line of the falling is drawn as follows. Consider a tangential line at each point on a spectrum curve when moving on the spectrum curve from the long wavelength side of the absorption peak to a maximum value. A slope of the tangential line increases as the curve rises (that is, as the vertical axis increases). A tangential line drawn at a point at which a value of the slope has a maximum value is taken as a tangential line to the falling on a long wavelength side of the absorption spectrum.

[Consideration on Organic Light-Emitting Layer]

In the organic light-emitting layer 25, as organic light emitters in which separation of charges occurs due to incidence of excited light, organic light emitters in which dipole moment (μ) is larger than 0 D can be used. The dipole moment is a value that can be calculated by quantum chemical calculation, and is a value that is generally calculated by a calculation method called a Hartree-Fock (HF) method or a density functional theory (DFT). Among these, the most commonly used condition (combination of a functional and a basis function) is B3LYP/6-31(d). As an example, dipole moment of TPA-DCPP is 13.05 D, and dipole moment of 4CzIPN is 3.85 D, dipole moment of Alq3 is 4.40 D, dipole moment of TBRb is 0.16 D, and dipole moment of 4CzTPN-Ph is 0 D. Note that, as in TBRb or 4CzTPN-Ph, even in organic light emitters in which dipole moment is less than 3 D, in a state in which a voltage is applied between the first electrode 21 and the second electrode 22 so that the reverse electric field occurs in the organic light-emitting layer 25, separation of charges occurs due to incidence of excited light.

However, if the dipole moment of the organic light emitters included in the organic light-emitting layer 25 is greater than 0 D, for example, in a case where a potential difference between the first electrode 21 and the second electrode 22 is set to 0 (or a value close to 0) in the first period and the delay period, and a voltage is applied between the first electrode 21 and the second electrode 22 so that the forward electric field to cause recoupling of charges occurs in the organic light-emitting layer 25 in the second period, even when the delay period is lengthened, sufficient light emission can be obtained from the organic light-emitting layer 25. Preferably, if the dipole moment of the organic light emitters is 3 D or greater (more preferably, the dipole moment of the organic light emitters is 10 D or greater), for example, in a case where a potential difference between the first electrode 21 and the second electrode 22 is set to 0 (or a value close to 0) in the first period and the delay period, and a voltage is applied between the first electrode 21 and the second electrode 22 so that the forward electric field to cause recoupling of charges occurs in the organic light-emitting layer 25 in the second period, even when the delay period is lengthened, more sufficient light emission can be obtained from the organic light-emitting layer 25.

As described above, even when the dipole moment of the organic light emitters included in the organic light-emitting layer 25 is less than 3 D, in a state in which a voltage is applied between the first electrode 21 and the second electrode 22 so that the reverse electric field occurs in the organic light-emitting layer 25, separation of charges occurs due to incidence of excited light. However, in the case of lengthening the delay period of maintaining a state in which a voltage is applied between the first electrode 21 and the second electrode 22 so that the reverse electric field occurs in the organic light-emitting layer 25, in the second period after passage of the delay period, even when applying a voltage between the first electrode 21 and the second electrode 22 so that the forward electric field to cause recoupling of charges occurs in the organic light-emitting layer 25, it is difficult to obtain sufficient light emission from the organic light-emitting layer 25. The reason for this is considered as follows. When maintaining a state in which a voltage is applied between the first electrode 21 and the second electrode 22 so that the reverse electric field occurs in the organic light-emitting layer 25 in the delay period, a minute leak current continuously flows to a system, and thus charges separated due to incidence of excited light disappear.

Note that, the configuration in which the potential difference between the first electrode 21 and the second electrode 22 is set to 0 in the first period and the delay period has the following merit. Specifically, occurrence of the reverse electric field in the organic light-emitting layer 25 is not repeated, and thus long operational lifetime of the organic light-emitting layer 25 can be realized. In addition, a dedicated power supply for applying a voltage between the first electrode 21 and the second electrode 22 in order for the reverse electric field to occur in the organic light-emitting layer 25 is not necessary, and thus simplification of a structure of the light-emitting device 1 can be realized.

As described above, to obtain stable light emission regardless of the length of the delay period, the dipole moment of the organic light emitters may be greater than 0 D, but the dipole moment of the organic light emitters is preferably 3 D or greater, and the dipole moment of the organic light emitters is more preferably 10 D or greater. However, when the dipole moment of the organic light emitters is greater than 30 D, sufficient transition dipole moment is not obtained, and a light emission quantum yield is less likely to increase (that is, large light emission intensity is not obtained), and thus the dipole moment of the organic light emitters is preferably less than 30 D.

[Experimental Result]

Hereinafter, experimental results will be described with reference to FIGS. 5A to 5C to FIG. 13 showing a relationship between time and light emission intensity. In the following description, a potential difference between the first electrode 21 and the second electrode 22 is simply referred to as "potential difference". In addition, application of a voltage between the first electrode 21 and the second electrode 22 so that the potential of the first electrode 21 becomes, for example, +5 V with the potential of the second electrode 22 set as a reference to cause the forward electric field to occur in the organic light-emitting layer 25 is noted as "application of a forward voltage of +5 V". In addition, application of a voltage between the first electrode 21 and the second electrode 22 so that the potential of the first electrode 21 becomes, for example, −10 V with the potential of the second electrode 22 set as a reference to cause the reverse electric field to occur in the organic light-emitting layer 25 is noted as "application of a reverse voltage of −10 V".

An organic light-emitting element 2 of Example 1 was manufactured as follows. First, a glass substrate on which the first electrode 21 formed from ITO having a thickness of 100 nm was prepared, and the first charge inflow blocking layer 23 formed from T2T was formed on the first electrode 21 by a vacuum evaporation method. Next, the organic light-emitting layer 25 formed from CBP (host material) and TPA-DCPP (organic light emitters) was formed on the first charge inflow blocking layer 23 by co-evaporation method from a different evaporation source. At this time, a mass ratio between the CBP and the TPA-DCPP was set to 50:50. Next, the second charge inflow blocking layer 24 formed from CBP was formed on the organic light-emitting layer 25 by the vacuum evaporation method. A total thickness of the first charge inflow blocking layer 23, the organic light-emitting layer 25, and the second charge inflow blocking layer 24 was 160 nm. Next, the second electrode 22 formed from aluminum was formed on the second charge inflow blocking layer 24 in a thickness of 100 nm by the vacuum evaporation method.

Figure 5A:
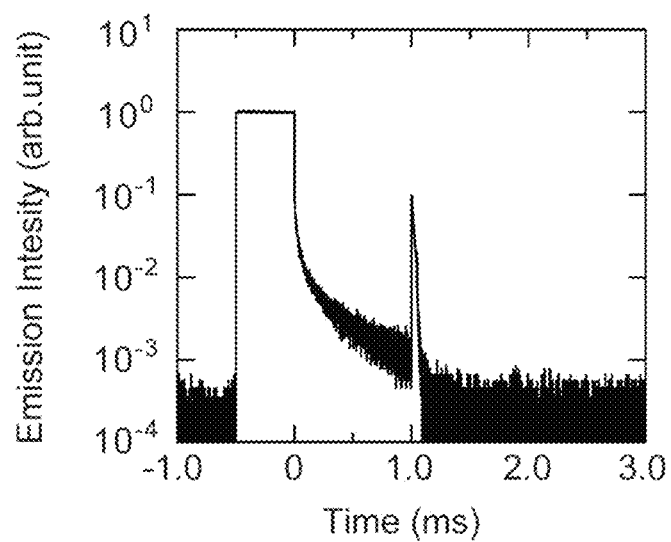
FIGS. 5A to 5C are graphs showing experimental results for an organic light-emitting element of Example 1.
Figure 5B:
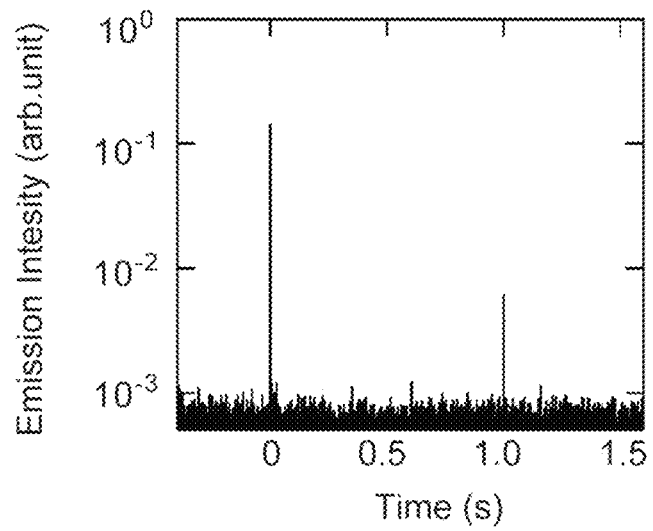
Figure 5C:
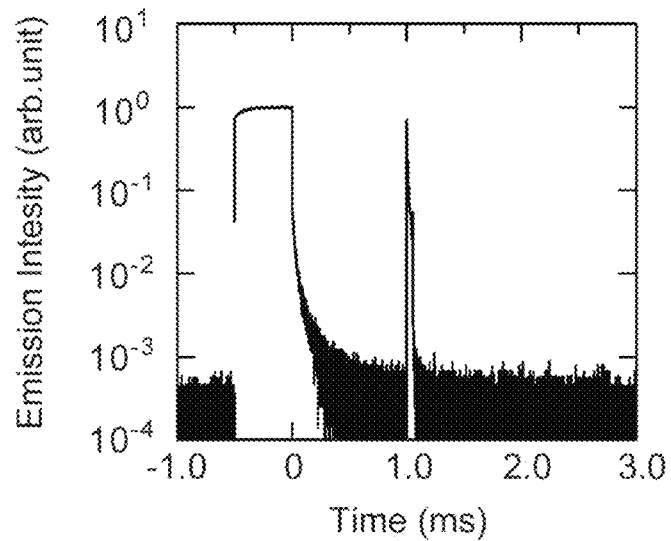

Experimental results on the organic light-emitting element 2 of Example 1 manufactured as described above are as follows. As shown in FIG. 5A, in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission (light emission spike) from the organic light-emitting layer 25 was observed in the second period. Note that, the reason why light emission intensity is obtained in the delay period of 0 to 1.0 msec is considered that parts of separated charges naturally recoupled. In addition, as shown in FIG. 5B, in a case where the potential difference was set to 0 and the excited light L1 was incident to the organic light-emitting layer 25 in the first period of −0.002 to 0 sec, the potential difference was maintained at 0 in the delay period of 0 to 1.0 sec, and the forward voltage of +5 V was applied in the second period of 1.0 to 1.00005 sec, light emission from the organic light-emitting layer 25 was observed in the second period. Even when the delay period is lengthened to one second, it could be understood that separated charges continuously remain in the organic light-emitting layer 25, and this leads to light emission due to recoupling of charges. In addition, as shown in FIG. 5C, in a case where the reverse voltage of −10 V was applied and the excited light L1 was incident to the organic light-emitting layer 25 in the first period of −0.5 to 0 msec, application of the reverse voltage of −10 V was maintained in the delay period of 0 to 1.0 msec, and the forward voltage of +5 V was applied in the second period of 1.0 to 1.05 msec, light emission from the organic light-emitting layer 25 was more strongly observed in the second period in comparison to the case of FIG. 5A. Note that, the intensity of the excited light L1 is the same in any cases of FIGS. 5A to 5C.

Figure 6A:
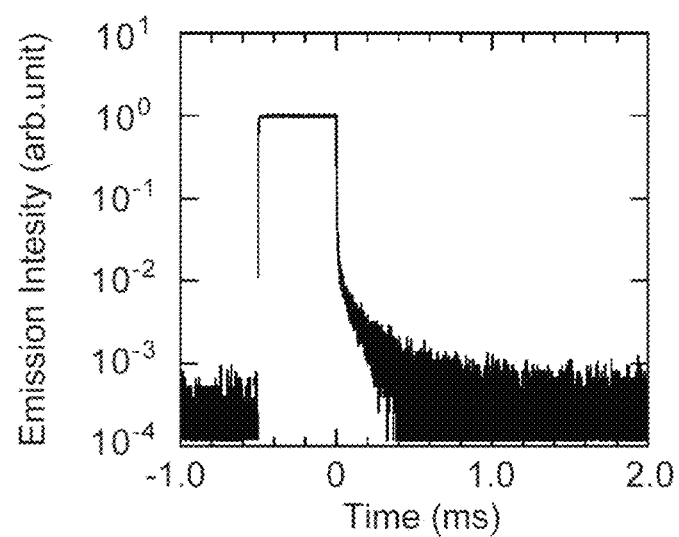
FIGS. 6A to 6C are graphs showing experimental results for an organic light-emitting element of Example 2.
Figure 6B:
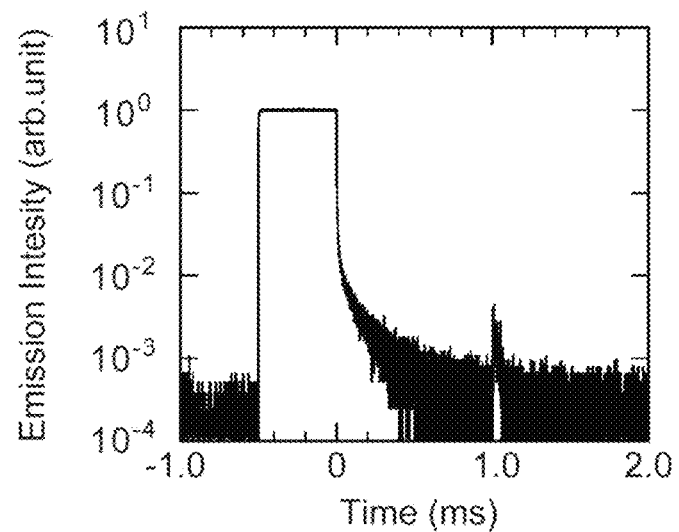
Figure 6C:
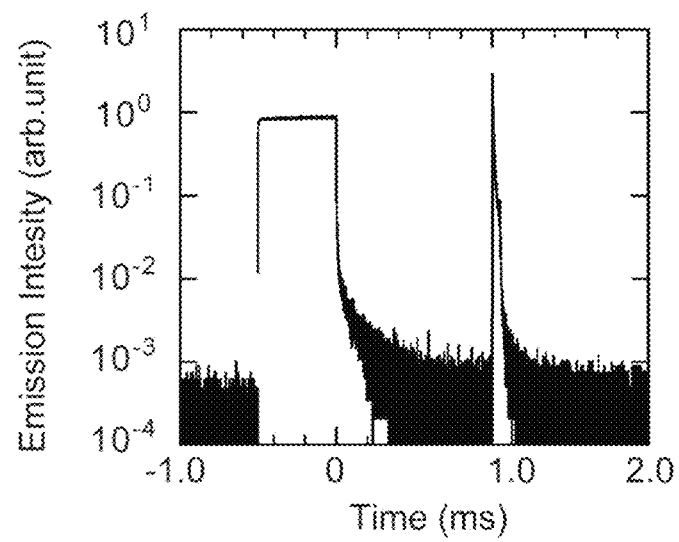

Next, an organic light-emitting element 2 of Example 2 was prepared. The organic light-emitting element 2 of Example 2 is different from the organic light-emitting element 2 of Example 1 in that the organic light emitters are 4CzIPN. Experimental results on the organic light-emitting element 2 of Example 2 are as follows. First, in a case where the potential difference was set to 0 and the excited light L1 was incident to the organic light-emitting layer 25 in the first period of −0.5 to 0 msec, and then the potential difference was maintained at 0, light emission intensity was as shown in FIG. 6A. In contrast, as shown in FIG. 6B, in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission from the organic light-emitting layer 25 was observed in the second period. In addition, as shown in FIG. 6C, in a case where the reverse voltage of −10 V was applied and the excited light L1 was incident to the organic light-emitting layer 25 in the first period of −0.5 to 0 msec, application of the reverse voltage of −10 V was maintained in the delay period of 0 to 1.0 msec, and the forward voltage of +5 V was applied in the second period of 1.0 to 1.05 msec, light emission from the organic light-emitting layer 25 was more strongly observed in the second period in comparison to the case of FIG. 6B. Note that, the intensity of the excited light L1 is the same in any cases of FIGS. 6A to 6C.

Figure 7A:
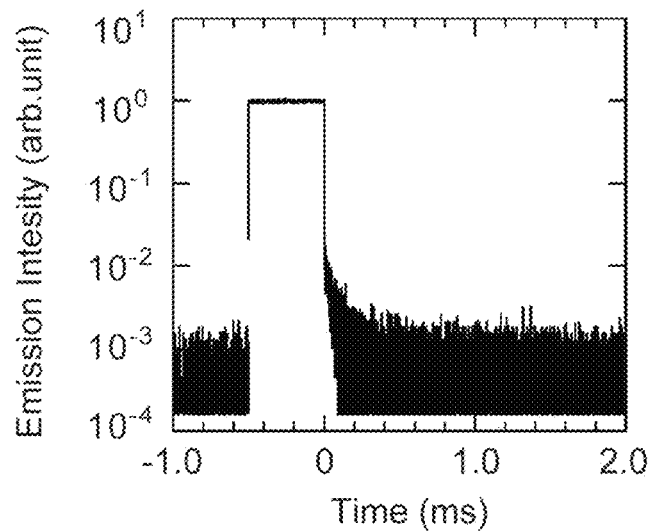
FIGS. 7A to 7C are graphs showing experimental results for an organic light-emitting element of Example 3.
Figure 7B:
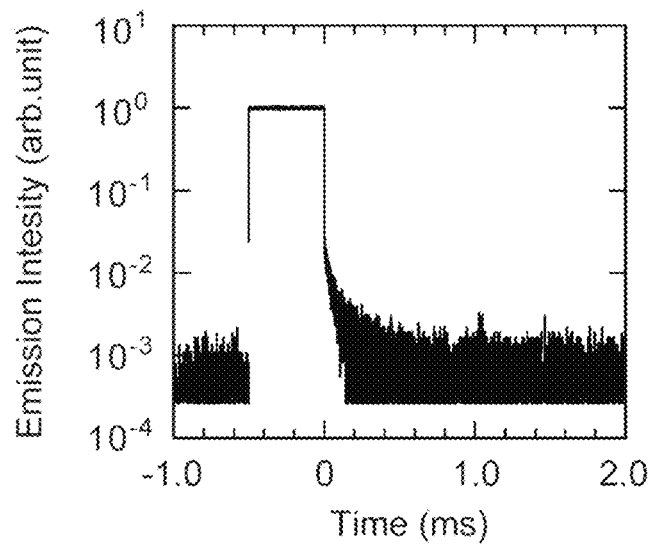
Figure 7C:
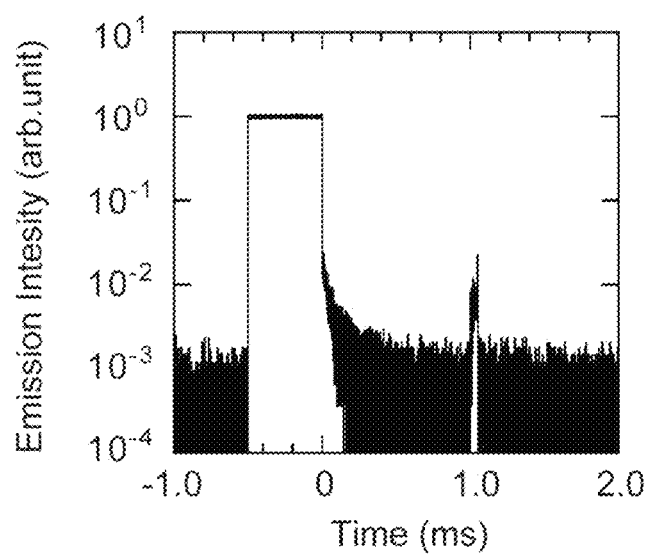

Next, an organic light-emitting element 2 of Example 3 was prepared. The organic light-emitting element 2 of Example 3 is different from the organic light-emitting element 2 of Example 1 in that the organic light emitters are Alq3. Experimental results on the organic light-emitting element 2 of Example 3 are as follows. First, in a case where the potential difference was set to 0 and the excited light L1 was incident to the organic light-emitting layer 25 in the first period of −0.5 to 0 msec, and then the potential difference was maintained at 0, light emission intensity was as shown in FIG. 7A. In contrast, as shown in FIG. 7B, in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission from the organic light-emitting layer 25 was observed in the second period. In addition, as shown in FIG. 7C, in a case where the reverse voltage of −10 V was applied and the excited light L1 was incident to the organic light-emitting layer 25 in the first period of −0.5 to 0 msec, application of the reverse voltage of −10 V was maintained in the delay period of 0 to 1.0 msec, and the forward voltage of +5 V was applied in the second period of 1.0 to 1.05 msec, light emission from the organic light-emitting layer 25 was more strongly observed in the second period in comparison to the case of FIG. 7B. Note that, the intensity of the excited light L1 is the same in any cases of FIGS. 7A to 7C.

Figure 8A:
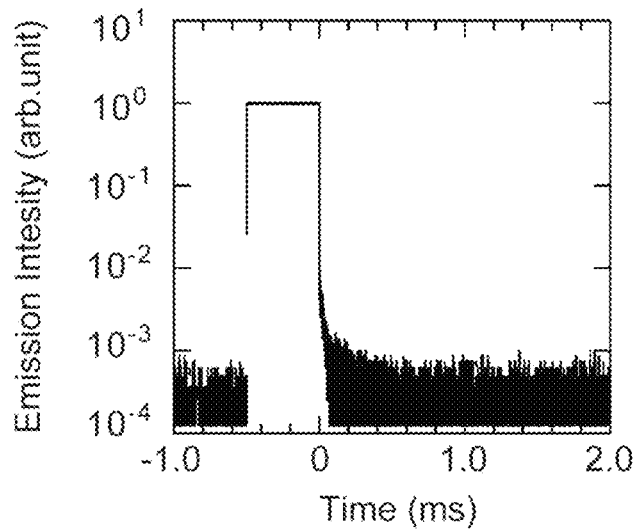
FIGS. 8A to 8C are graphs showing experimental results for an organic light-emitting element of Example 4.
Figure 8B:
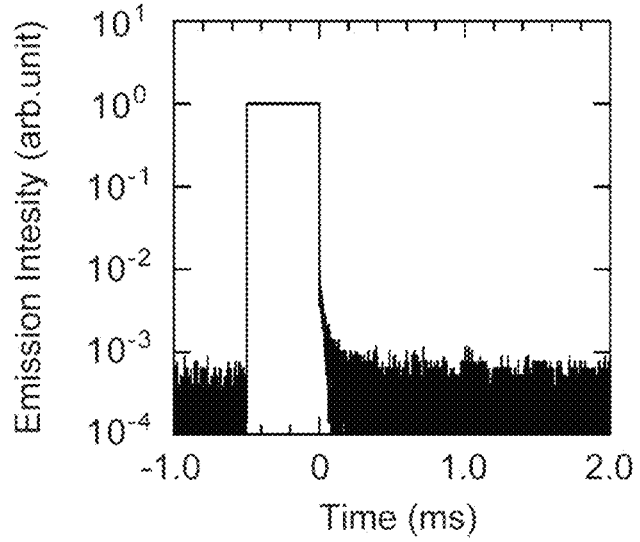
Figure 8C:
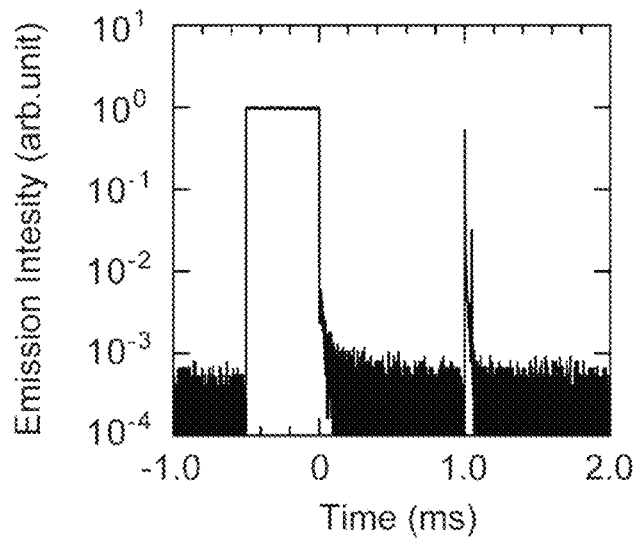

Next, an organic light-emitting element 2 of Example 4 was prepared. The organic light-emitting element 2 of Example 4 is different from the organic light-emitting element 2 of Example 1 in that the organic light emitters are TBRb. Experimental results on the organic light-emitting element 2 of Example 4 are as follows. First, in a case where the potential difference was set to 0 and the excited light L1 was incident to the organic light-emitting layer 25 in the first period of −0.5 to 0 msec, and then the potential difference was maintained at 0, light emission intensity was as shown in FIG. 8A. In contrast, as shown in FIG. 8B, even in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission from the organic light-emitting layer 25 was not significantly observed in the second period. In addition, as shown in FIG. 8C, in a case where the reverse voltage of −10 V was applied and the excited light L1 was incident to the organic light-emitting layer 25 in the first period of −0.5 to 0 msec, application of the reverse voltage of −10 V was maintained in the delay period of 0 to 1.0 msec, and the forward voltage of +5 V was applied in the second period of 1.0 to 1.05 msec, light emission from the organic light-emitting layer 25 was observed in the second period. Note that, the intensity of the excited light L1 is the same in any cases of FIGS. 8A to 8C.

From the results on the organic light-emitting elements of Example 1 to Example 4 as described above, in a case where the organic light emitters in which separation of charges occurs due to incidence of the excited light L1 is used, and the reverse voltage is applied in at least in the first period and the delay period, it is considered that light emission from the organic light-emitting layer 25 is observed in the second period.

Figure 9A:
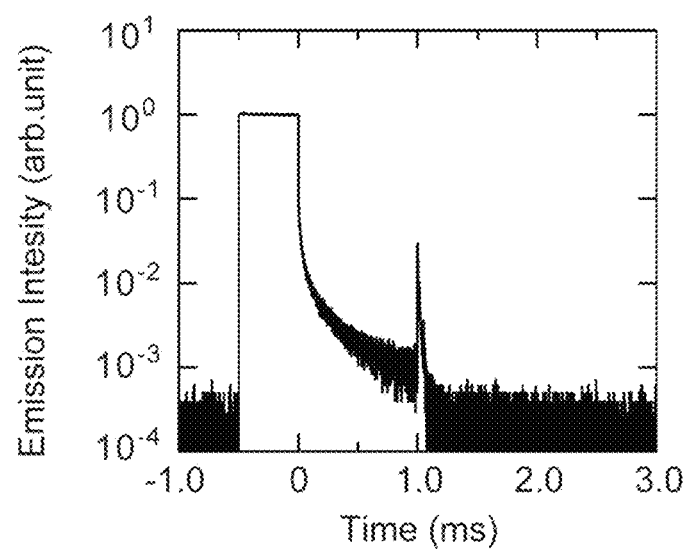
FIGS. 9A to 9C are graphs showing experimental results for an organic light-emitting element of Example 5.
Figure 9B:
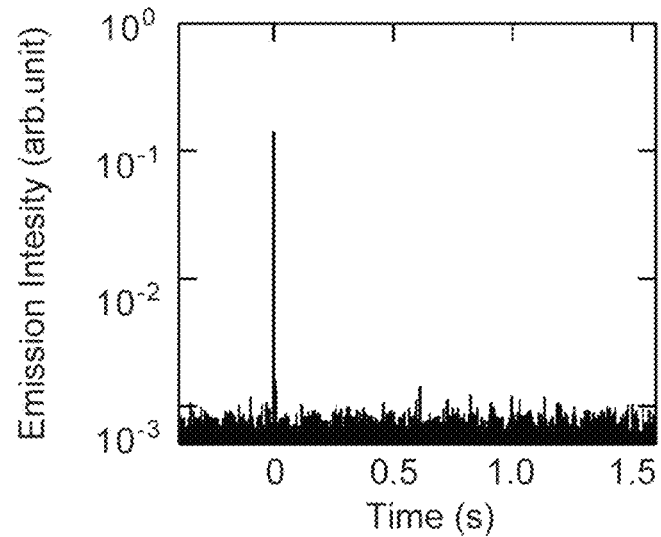
Figure 9C:
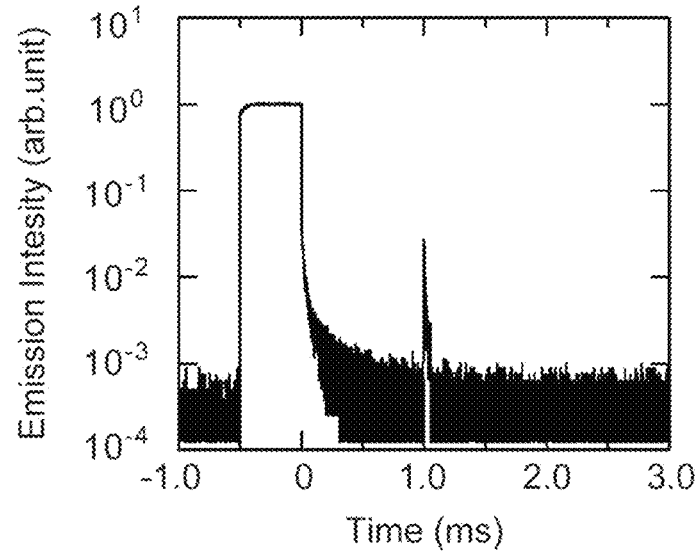

Next, an organic light-emitting element 2 of Example 5 was prepared. The organic light-emitting element 2 of Example 5 is different from the organic light-emitting element 2 of Example 1 in that the second charge inflow blocking layer 24 is not provided. Experimental results on the organic light-emitting element 2 of Example 5 are as follows. As shown in FIG. 9A, in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission from the organic light-emitting layer 25 was observed in the second period. In addition, as shown in FIG. 9B, in a case where the potential difference was set to 0 and the excited light L1 was incident to the organic light-emitting layer 25 in the first period of −0.002 to 0 sec, the potential difference was maintained at 0 in the delay period of 0 to 1.0 sec, and the forward voltage of +5 V was applied in the second period of 1.0 to 1.00005 sec, light emission from the organic light-emitting layer 25 was not significantly observed in the second period. In addition, as shown in FIG. 9C, in a case where the reverse voltage of −10 V was applied and the excited light L1 was incident to the organic light-emitting layer 25 in the first period of −0.5 to 0 msec, application of the reverse voltage of −10 V was maintained in the delay period of 0 to 1.0 msec, and the forward voltage of +5 V was applied in the second period of 1.0 to 1.05 msec, light emission from the organic light-emitting layer 25 was observed in the second period. Note that, the intensity of the excited light L1 is the same in any cases of FIGS. 9A to 9C.

Figure 10A:
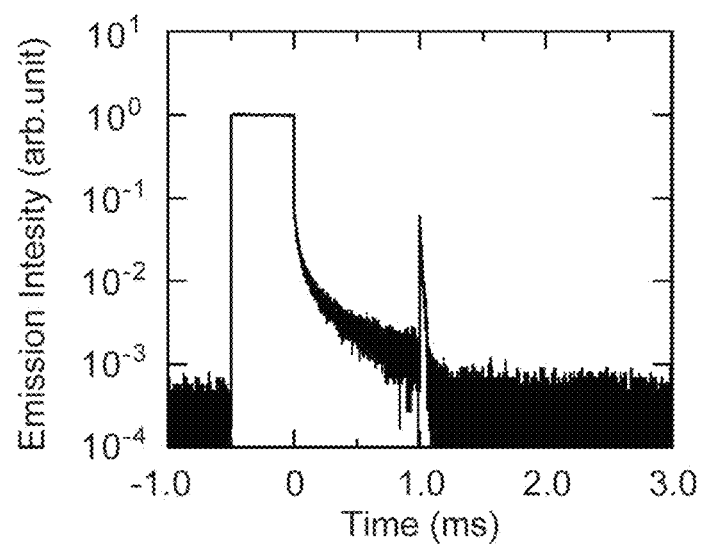
FIGS. 10A to 10C are graphs showing experimental results for an organic light-emitting element of Example 6.
Figure 10B:
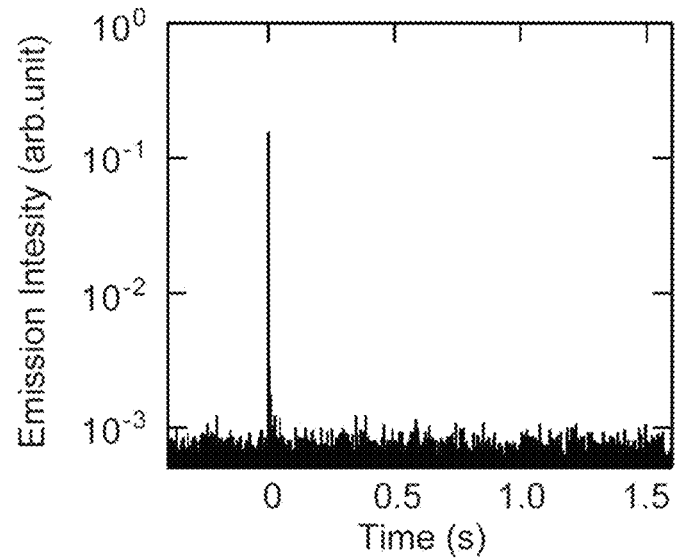
Figure 10C:
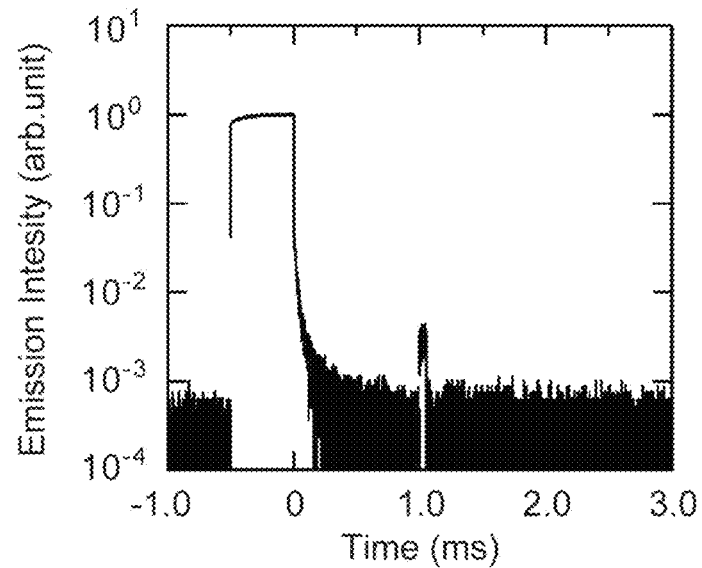

Next, an organic light-emitting element 2 of Example 6 was prepared. The organic light-emitting element 2 of Example 6 is different from the organic light-emitting element 2 of Example 1 in that the first charge inflow blocking layer 23 is not provided. Experimental results on the organic light-emitting element 2 of Example 6 are as follows. As shown in FIG. 10A, in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission from the organic light-emitting layer 25 was observed in the second period. In addition, as shown in FIG. 10B, in a case where the potential difference was set to 0 and the excited light L1 was incident to the organic light-emitting layer 25 in the first period of −0.002 to 0 sec, the potential difference was maintained at 0 in the delay period of 0 to 1.0 sec, and the forward voltage of +5 V was applied in the second period of 1.0 to 1.00005 sec, light emission from the organic light-emitting layer 25 was not significantly observed in the second period. In addition, as shown in FIG. 10C, in a case where the reverse voltage of −10 V was applied and the excited light L1 was incident to the organic light-emitting layer 25 in the first period of −0.5 to 0 msec, application of the reverse voltage of −10 V was maintained in the delay period of 0 to 1.0 msec, and the forward voltage of +5 V was applied in the second period of 1.0 to 1.05 msec, light emission from the organic light-emitting layer 25 was observed in the second period. Note that, the intensity of the excited light L1 is the same in any cases of FIGS. 10A to 10C.

Figure 11A:
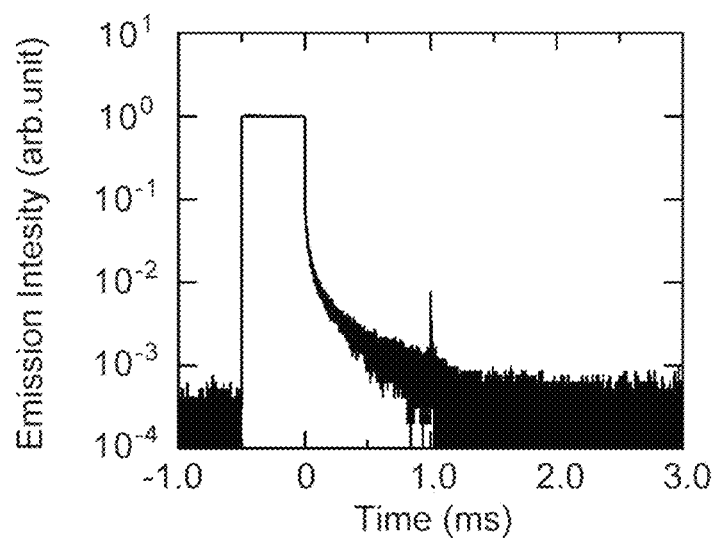
FIGS. 11A to 11C are graphs showing experimental results for an organic light-emitting element of Example 7.
Figure 11B:
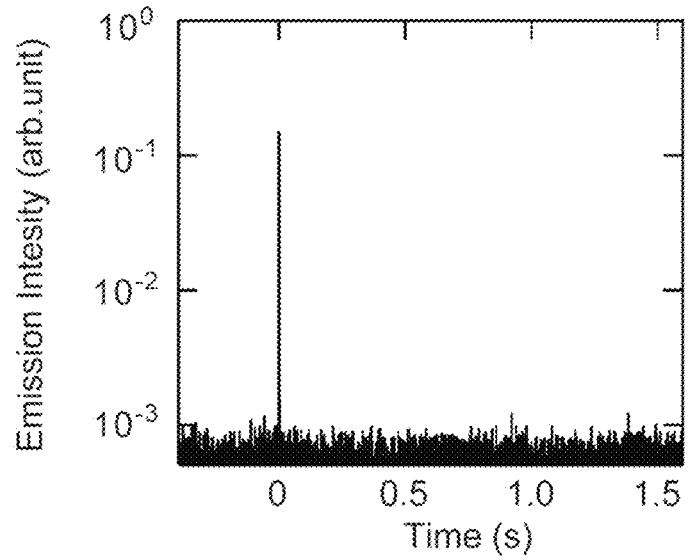
Figure 11C:
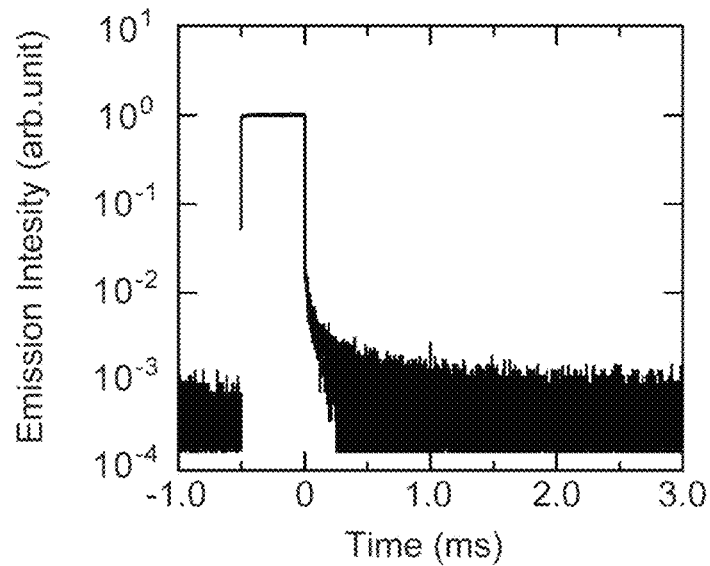

Next, an organic light-emitting element 2 of Example 7 was prepared. The organic light-emitting element 2 of Example 7 is different from the organic light-emitting element 2 of Example 1 in that the first charge inflow blocking layer 23 and the second charge inflow blocking layer 24 are not provided. Experimental results on the organic light-emitting element 2 of Example 7 are as follows. As shown in FIG. 11A, in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission from the organic light-emitting layer 25 was observed in the second period. In addition, as shown in FIG. 11B, in a case where the potential difference was set to 0 and the excited light L1 was incident to the organic light-emitting layer 25 in the first period of −0.002 to 0 sec, the potential difference was maintained at 0 in the delay period of 0 to 1.0 sec, and the forward voltage of +5 V was applied in the second period of 1.0 to 1.00005 sec, light emission from the organic light-emitting layer 25 was not significantly observed in the second period. In addition, as shown in FIG. 11C, in a case where the reverse voltage of −10 V was applied and the excited light L1 was incident to the organic light-emitting layer 25 in the first period of −0.5 to 0 msec, application of the reverse voltage of −10 V was maintained in the delay period of 0 to 1.0 msec, and the forward voltage of +5 V was applied in the second period of 1.0 to 1.05 msec, light emission from the organic light-emitting layer 25 was observed in the second period. Note that, the intensity of the excited light L1 is the same in any cases of FIGS. 11A to 11C.

From the results of Example 1, and Example 5 to Example 7 as described above, in a case where the organic light-emitting element 2 includes the first charge inflow blocking layer 23 and the second charge inflow blocking layer 24 (the case of Example 1), it could be understood that even when the delay period is further lengthened in comparison to a case where the organic light-emitting element 2 includes only the first charge inflow blocking layer 23 (the case of Example 5), a case where the organic light-emitting element 2 includes only the second charge inflow blocking layer 24 (the case of Example 6), and a case where the organic light-emitting element 2 does not include the first charge inflow blocking layer 23 and the second charge inflow blocking layer 24 (the case of Example 7), light emission from the organic light-emitting layer 25 is obtained. In addition, when the delay period is short, it could be understood that light emission is obtained from the organic light-emitting layer 25 even in a case where the organic light-emitting element 2 includes only the first charge inflow blocking layer 23 (the case of Example 5) and in a case where the organic light-emitting element 2 includes only the second charge inflow blocking layer 24 (the case of Example 6).

Note that, when the delay period is short, it could be understood that in a case where the organic light-emitting element 2 includes only the second charge inflow blocking layer 24 (the case of Example 6), light emission from the organic light-emitting layer 25 is more strongly obtained in comparison to a case where the organic light-emitting element 2 includes only the first charge inflow blocking layer 23 (the case of Example 5). From this result, it is considered that a configuration in which the second charge inflow blocking layer 24 is disposed between the second electrode 22 having work function smaller than work function of the first electrode 21 and the organic light-emitting layer 25 is advantageous for obtaining light emission from the organic light-emitting layer 25 against a configuration in which the first charge inflow blocking layer 23 is disposed between the first electrode 21 having work function greater than work function of the second electrode 22 and the organic light-emitting layer 25.

Figure 12A:
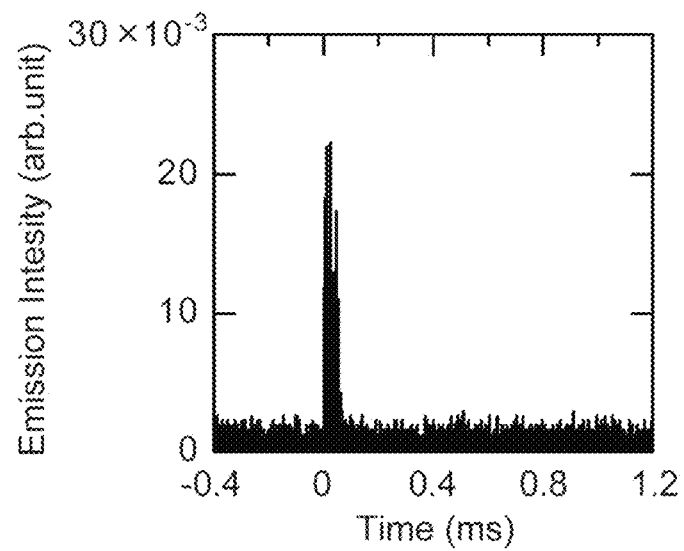
FIGS. 12A to 12C are graphs showing experimental results for the organic light-emitting element of Example 1.
Figure 12B:
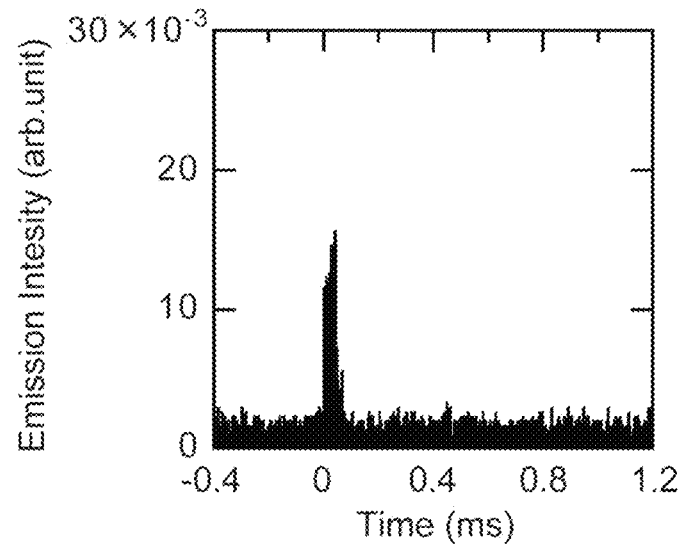
Figure 12C:
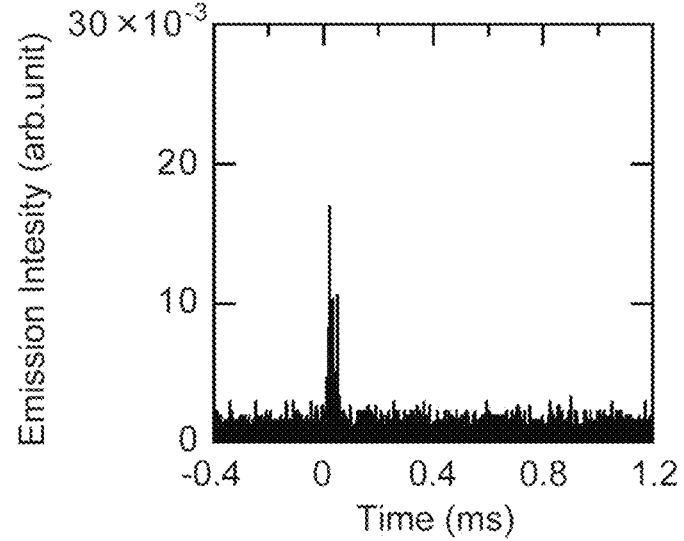

In addition, in a case where the organic light-emitting element 2 includes the first charge inflow blocking layer 23 and the second charge inflow blocking layer 24 (the case of Example 1), as shown in FIGS. 12A to 12C, light emission from the organic light-emitting layer 25 was observed even when the delay period was set to 30 seconds, one minute, or one hour. Experimental results shown in FIGS. 12A to 12C are experimental results in a case where the potential difference was set to 0 and the excited light L1 was incident to the organic light-emitting layer 25 in the first period for 2.0 msec, the potential difference was maintained at 0 in each of the delay periods, and the forward voltage of +5 V was applied in the second period for 0.05 msec after the delay period, and the intensity of the excited light L1 is the same in each case. Note that, light emission spikes shown in FIGS. 12A to 12C are light emission spikes in the second period, and the first period is not shown in FIGS. 12A to 12C.

Figure 13:
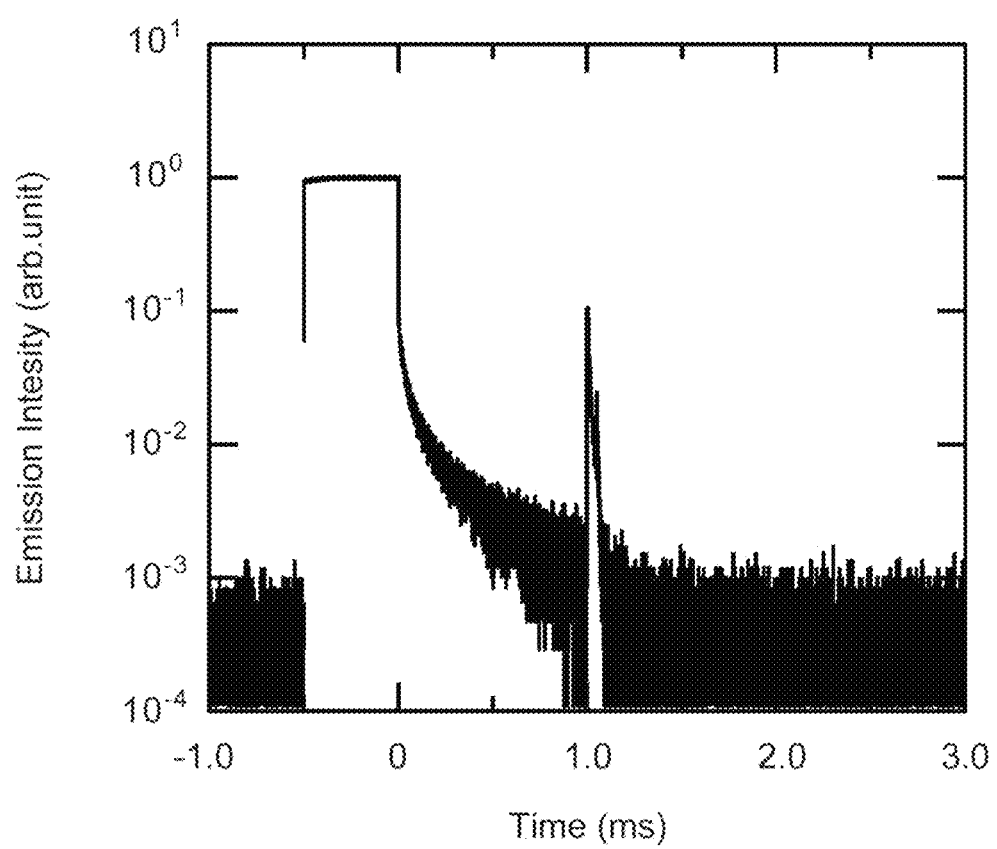
FIG. 13 is a graph showing an experimental result for an organic light-emitting element of Example 8.

Next, an organic light-emitting element 2 of Example 8 was prepared. The organic light-emitting element 2 of Example 8 is different from the organic light-emitting element 2 of Example 1 in that the organic light-emitting layer 25 is formed from only TPA-DCPP (that is, the organic light-emitting layer 25 does not contain the host material). Experimental results on the organic light-emitting element 2 of Example 8 are as follows. As shown in FIG. 13, in a case where the potential difference was set to 0 and the excited light L1 was incident to the organic light-emitting layer 25 in the first period of −0.5 to 0 msec, the potential difference was maintained at 0 in the delay period of 0 to 1.0 msec, and the forward voltage of +5 V was applied in the second period of 1.0 to 1.05 msec, light emission from the organic light-emitting layer 25 was observed in the second period. From the result, it could be understood that even when the organic light-emitting layer 25 does not contain the host material, light emission is obtained from the organic light-emitting layer 25.

Figures 15A, 15B:
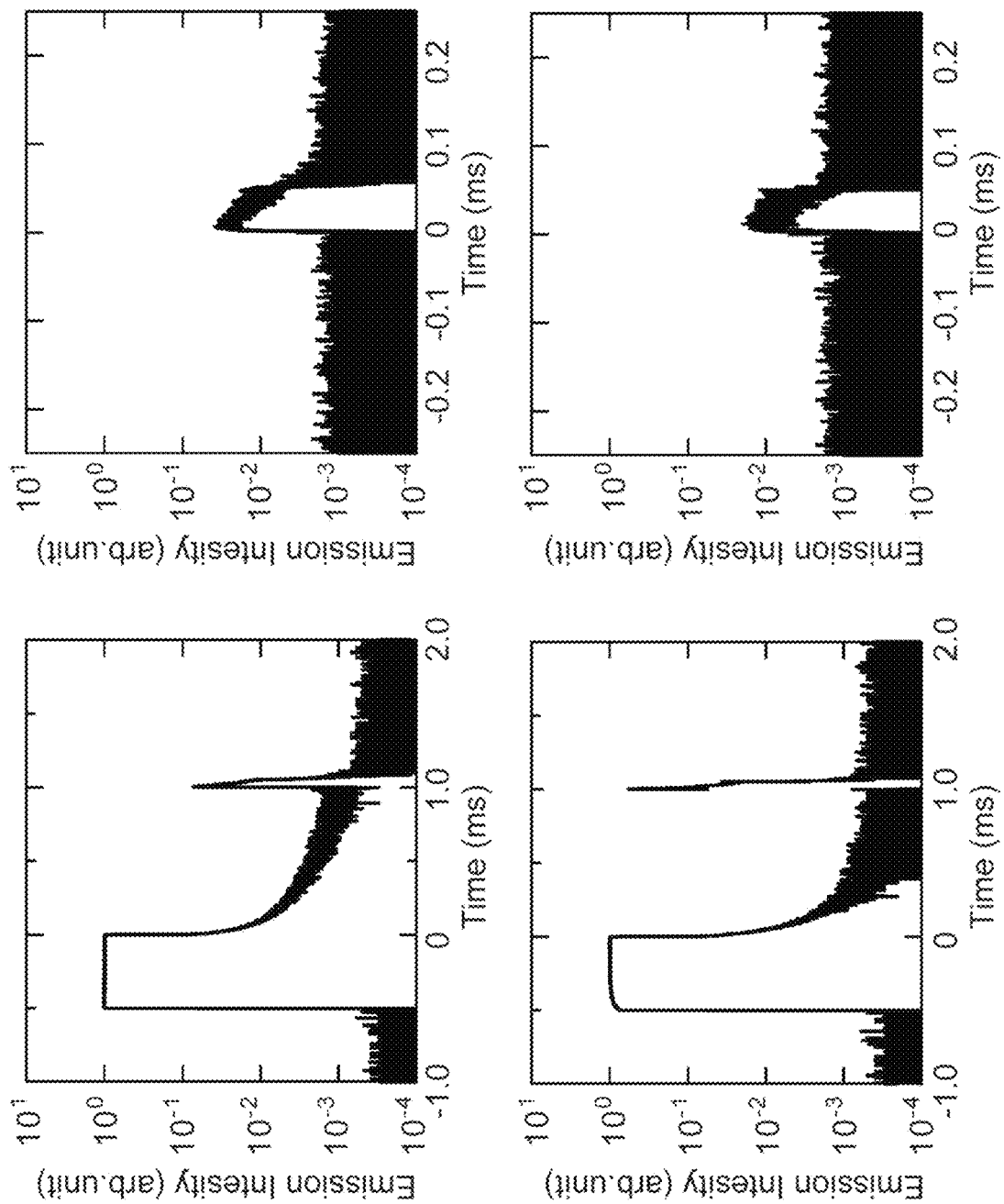
FIGS. 15A and 15B are graphs showing experimental results for the organic light-emitting element of Example 1.

Next, the organic light-emitting element 2 of Example 1 was prepared again. In the organic light-emitting element 2 of Example 1, TPA-DCPP in which the dipole moment is 13.05 D was used as the organic light emitters. In a graph on the left side in FIG. 15A, in a case where the potential difference was set to 0 and the excited light L1 was incident to the organic light-emitting layer 25 in the first period for 0.5 msec (−0.5 to 0 msec), the potential difference was maintained at 0 in the delay period for 1.0 msec (0 to 1.0 msec), and the forward voltage of +5 V was applied in the second period for 0.05 msec (1.0 to 1.05 msec), light emission from the organic light-emitting layer 25 was observed in the second period. In a graph on the right side in FIG. 15A, in a case where the potential difference was set to 0 and the excited light L1 was incident to the organic light-emitting layer 25 in the first period for 0.5 msec (−1000.5 to −1000.0 msec), the potential difference was maintained at 0 in the delay period for one second (−1000.0 to 0 msec), and the forward voltage of +5 V was applied in the second period for 0.05 sec (0 to 0.05 msec), light emission from the organic light-emitting layer 25 was observed in the second period. The delay period in the case shown in the graph on the right side in FIG. 15A corresponds to 1000 times the delay period in the case shown in the graph on the left side in FIG. 15A. In this case, light emission intensity in the case shown in the graph on the right side in FIG. 15A does not decrease by one digit from light emission intensity in the case shown in the graph on the left side in FIG. 15A.

Similarly, the organic light-emitting element 2 of Example 1 was prepared again. In a graph on the left side in FIG. 15B, in a case where the reverse voltage of −10 V was applied and the excited light L1 was incident to the organic light-emitting layer 25 in the first period for 0.5 msec (−0.5 to 0 msec), application of the reverse voltage of −10 V was maintained in the delay period for 1.0 msec (0 to 1.0 msec), and the forward voltage of +5 V was applied in the second period for 0.05 msec (1.0 to 1.05 msec), light emission from the organic light-emitting layer 25 was observed in the second period. In a graph on the right side in FIG. 15B, in a case where the reverse voltage of −10 V was applied and the excited light L1 was incident to the organic light-emitting layer 25 in the first period for 0.5 msec (−1000.5 to −1000.0 msec), application of the reverse voltage of −10 V was maintained in the delay period for one second (−1000.0 to 0 msec), and the forward voltage of +5 V was applied in the second period for 0.05 sec (0 to 0.05 msec), light emission from the organic light-emitting layer 25 was observed in the second period. The delay period in the case shown in the graph on the right side in FIG. 15B corresponds to 1000 times the delay period in the case shown in the graph on the left side in FIG. 15B. In this case, light emission intensity in the case shown in the graph on the right side in FIG. 15B decreases by one digit or more from light emission intensity in the case shown in the graph on the left side in FIG. 15B.

Figures 16A, 16B:
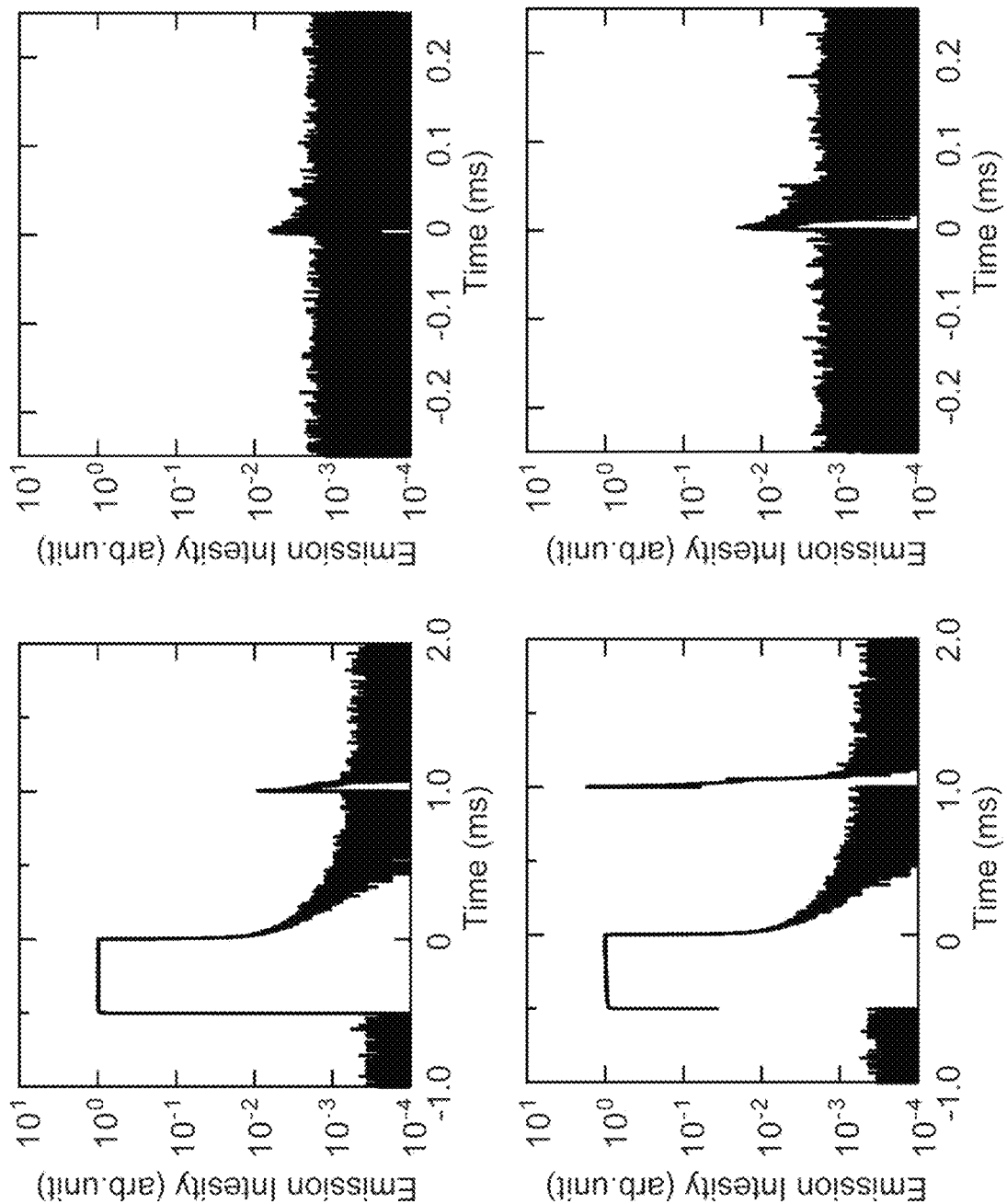
FIGS. 16A and 16B are graphs showing experimental results for the organic light-emitting element of Example 2.

Next, the organic light-emitting element 2 of Example 2 was prepared again. In the organic light-emitting element 2 of Example 2, 4CzIPN in which the dipole moment is 3.85 D was used as the organic light emitters. In a graph on the left side in FIG. 16A, in a case where the potential difference was set to 0 and the excited light L1 was incident to the organic light-emitting layer 25 in the first period for 0.5 msec (−0.5 to 0 msec), the potential difference was maintained at 0 in the delay period for 1.0 msec (0 to 1.0 msec), and the forward voltage of +5 V was applied in the second period for 0.05 msec (1.0 to 1.05 msec), light emission from the organic light-emitting layer 25 was observed in the second period. In a graph on the right side in FIG. 16A, in a case where the potential difference was set to 0 and the excited light L1 was incident to the organic light-emitting layer 25 in the first period for 0.5 msec (−1000.5 to −1000.0 msec), the potential difference was maintained at 0 in the delay period for one second (−1000.0 to 0 msec), and the forward voltage of +5 V was applied in the second period for 0.05 sec (0 to 0.05 msec), light emission from the organic light-emitting layer 25 was observed in the second period. The delay period in the case shown in the graph on the right side in FIG. 16A corresponds to 1000 times the delay period in the case shown in the graph on the left side in FIG. 16A. In this case, light emission intensity in the case shown in the graph on the right side in FIG. 16A does not decrease by one digit from light emission intensity in the case shown in the graph on the left side in FIG. 16A.

Similarly, the organic light-emitting element 2 of Example 2 was prepared again. In a graph on the left side in FIG. 16B, in a case where the reverse voltage of −10 V was applied and the excited light L1 was incident to the organic light-emitting layer 25 in the first period for 0.5 msec (−0.5 to 0 msec), application of the reverse voltage of −10 V was maintained in the delay period for 1.0 msec (0 to 1.0 msec), and the forward voltage of +5 V was applied in the second period for 0.05 msec (1.0 to 1.05 msec), light emission from the organic light-emitting layer 25 was observed in the second period. In a graph on the right side in FIG. 16B, in a case where the reverse voltage of −10 V was applied and the excited light L1 was incident to the organic light-emitting layer 25 in the first period for 0.5 msec (−1000.5 to −1000.0 msec), application of the reverse voltage of −10 V was maintained in the delay period for one second (−1000.0 to 0 msec), and the forward voltage of +5 V was applied in the second period for 0.05 sec (0 to 0.05 msec), light emission from the organic light-emitting layer 25 was observed in the second period. The delay period in the case shown in the graph on the right side in FIG. 16B corresponds to 1000 times the delay period in the case shown in the graph on the left side in FIG. 16B. In this case, light emission intensity in the case shown in the graph on the right side in FIG. 16B decreases by one digit or more from light emission intensity in the case shown in the graph on the left side in FIG. 16B.

Figures 17A, 17B:
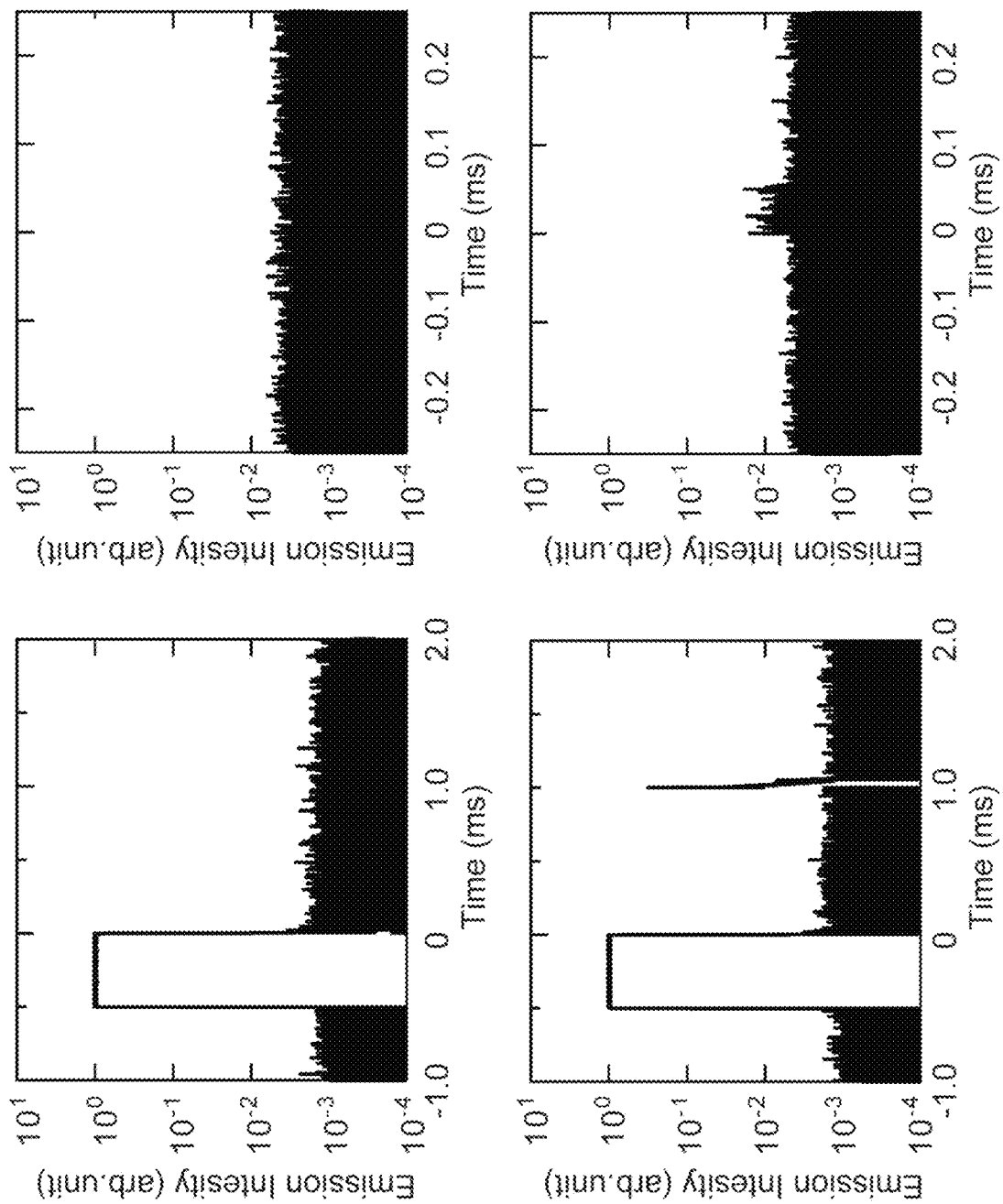
FIGS. 17A and 17B are graphs showing experimental results for the organic light-emitting element of Example 9.

Next, an organic light-emitting element 2 of Example 9 was prepared. The organic light-emitting element 2 of Example 9 is different from the organic light-emitting element 2 of Example 1 in that the organic light emitters are 4CzTPN-Ph. In the organic light-emitting element 2 of Example 9, 4CzTPN-Ph in which the dipole moment is 0 D was used as the organic light emitters. In a graph on the left side in FIG. 17A, in a case where the potential difference was set to 0 and the excited light L1 was incident to the organic light-emitting layer 25 in the first period for 0.5 msec (−0.5 to 0 msec), the potential difference was maintained at 0 in the delay period for 1.0 msec (0 to 1.0 msec), and the forward voltage of +5 V was applied in the second period for 0.05 msec (1.0 to 1.05 msec), light emission from the organic light-emitting layer 25 was not observed in the second period. In a graph on the right side in FIG. 17A, in a case where the potential difference was set to 0 and the excited light L1 was incident to the organic light-emitting layer 25 in the first period for 0.5 msec (−1000.5 to −1000.0 msec), the potential difference was maintained at 0 in the delay period for one second (−1000.0 to 0 msec), and the forward voltage of +5 V was applied in the second period for 0.05 sec (0 to 0.05 msec), light emission from the organic light-emitting layer 25 was not observed in the second period. The delay period in the case shown in the graph on the right side in FIG. 17A corresponds to 1000 times the delay period in the case shown in the graph on the left side in FIG. 17A.

Similarly, the organic light-emitting element 2 of Example 9 was prepared again. In a graph on the left side in FIG. 17B, in a case where the reverse voltage of −10 V was applied and the excited light L1 was incident to the organic light-emitting layer 25 in the first period for 0.5 msec (−0.5 to 0 msec), application of the reverse voltage of −10 V was maintained in the delay period for 1.0 msec (0 to 1.0 msec), and the forward voltage of +5 V was applied in the second period for 0.05 msec (1.0 to 1.05 msec), light emission from the organic light-emitting layer 25 was observed in the second period. In a graph on the right side in FIG. 17B, in a case where the reverse voltage of −10 V was applied and the excited light L1 was incident to the organic light-emitting layer 25 in the first period for 0.5 msec (−1000.5 to −1000.0 msec), application of the reverse voltage of −10 V was maintained in the delay period for one second (−1000.0 to 0 msec), and the forward voltage of +5 V was applied in the second period for 0.05 sec (0 to 0.05 msec), light emission from the organic light-emitting layer 25 was observed in the second period. The delay period in the case shown in the graph on the right side in FIG. 17B corresponds to 1000 times the delay period in the case shown in the graph on the left side in FIG. 17B. In this case, light emission intensity in the case shown in the graph on the right side in FIG. 17B decreases by one digit or more from light emission intensity in the case shown in the graph on the left side in FIG. 17B.

From the graphs shown in FIGS. 15A and 15B, FIGS. 16A and 16B, and FIGS. 17A and 17B, it could be understood that when the dipole moment of the organic light emitters included in the organic light-emitting layer 25 is greater than 0 D, for example, in a case where, the potential difference between the first electrode 21 and the second electrode 22 is set to 0 in the first period and the delay period, and a voltage is applied between the first electrode 21 and the second electrode 22 so that the forward electric field to cause recoupling of charges occurs in the organic light-emitting layer 25 in the second period, even when the delay period is lengthened, sufficient light emission can be obtained from the organic light-emitting layer 25. In addition, preferably, if the dipole moment of the organic light emitters is 3 D or greater (more preferably, the dipole moment of the organic light emitters is 10 D or greater), for example, in a case where the potential difference between the first electrode 21 and the second electrode 22 is set to 0 in the first period and the delay period, and a voltage is applied between the first electrode 21 and the second electrode 22 so that the forward electric field to cause recoupling of charges occurs in the organic light-emitting layer 25 in the second period, even when the delay period is lengthened, more sufficient light emission can be obtained from the organic light-emitting layer 25. Note that, the intensity of the excited light L1 was the same in any cases of FIGS. 15A and 15B, FIGS. 16A and 16B, and FIGS. 17A and 17B.

Modification Example

Figure 14:
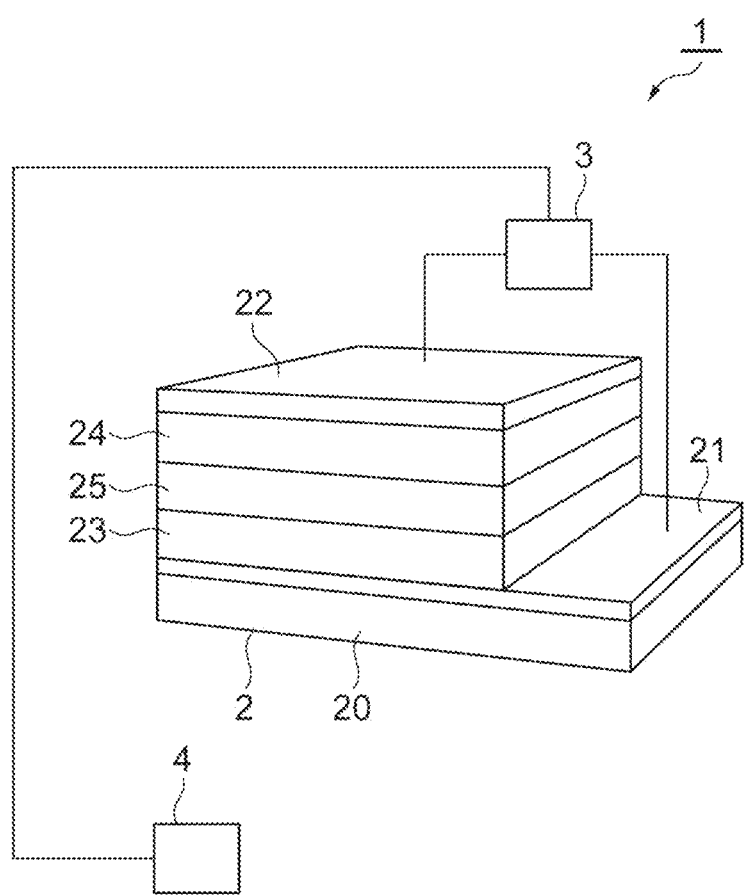
FIG. 14 is a configuration diagram of a light-emitting device of a modification example.

The light-emitting device, the light-emitting method, and the organic light-emitting element of the present disclosure are not limited to the above-described embodiment. For example, as illustrated in FIG. 14, the light-emitting device 1 may further include a light source 4 that emits the excited light L1, and the control unit 3 may control the light source 4 so that the excited light L1 is incident to the organic light-emitting layer 25 in the first period. According to this, it is possible to adjust timing at which the excited light L1 is incident to the organic light-emitting layer 25 from the outside.

In addition, in the embodiment, in the organic light-emitting element 2, the first charge inflow blocking layer 23 is disposed between the first electrode 21 and the organic light-emitting layer 25, and the second charge inflow blocking layer 24 is disposed between the second electrode 22 and the organic light-emitting layer 25. However, the first charge inflow blocking layer 23 may not disposed between the first electrode 21 and the organic light-emitting layer 25. Alternatively, the second charge inflow blocking layer 24 may not disposed between the second electrode 22 and the organic light-emitting layer 25. However, according to the configuration in which the first charge inflow blocking layer 23 is disposed between the first electrode 21 and the organic light-emitting layer 25, and the second charge inflow blocking layer 24 is disposed between the second electrode 22 and the organic light-emitting layer 25, light emission from the organic light-emitting layer 25 can be more reliably obtained in the second period. In addition, as described above, the configuration in which the second charge inflow blocking layer 24 is disposed between the second electrode 22 having work function smaller than work function of the first electrode 21 and the organic light-emitting layer 25 is advantageous for obtaining light emission from the organic light-emitting layer 25 against a configuration in which the first charge inflow blocking layer 23 is disposed between the first electrode 21 having work function greater than work function of the second electrode 22 and the organic light-emitting layer 25.

In addition, in the organic light-emitting element 2, each of the first charge inflow blocking layer 23 and the second charge inflow blocking layer 24 may be formed from an electrical insulating material. In addition, for example, a plurality of the organic light-emitting elements 2 may be two-dimensionally arranged on one sheet of the light-transmitting substrate 20. In addition, for example, the control unit 3 may apply the reverse voltage in the first period and the delay period, and may set the potential difference to 0 in the second period. That is, in the second period, in a case where the potential difference between the first electrode 21 and the second electrode 22 can be changed so that recoupling of charges occurs, light emission from the organic light-emitting layer 25 can be obtained in the second period.

In addition, the organic light-emitting element 2 may be in an electrically floating state (in other words, a state in which the potentials of the first electrode 21 and the second electrode 22 are independent) in the first period (that is, a step in which the excited light L1 is incident to the organic light-emitting layer 25). For example, in the light-emitting device 1, the organic light-emitting element 2 may be physically separated from the control unit 3 to bring the organic light-emitting element 2 into the electrically floating state in the first period. According to this, charges separated in the organic light-emitting layer 25 due to incidence of the excited light L1 can be suppressed from being reduced due to inflow of charges from the first electrode 21 and the second electrode 22 to the organic light-emitting layer 25. As a result, when the potential difference between the first electrode 21 and the second electrode 22 is changed so that recoupling of charges occurs in the second period, light emission can be reliably obtained from the organic light-emitting layer 25 in the second period. In addition, for example, in the light-emitting device 1, the control unit 3 may bring the organic light-emitting element 2 into the electrically floating state in the first period by switching a switch provided in an interconnection connected to each of the first electrode 21 and the second electrode 22 from ON to OFF. Note that, presence of at least one of the first charge inflow blocking layer 23 and the second charge inflow blocking layer 24 in the organic light-emitting element 2 is effective for suppressing charges from flowing into the organic light-emitting layer 25 only by connecting an interconnection for changing the potential difference between the first electrode 21 and the second electrode 22 to at least one of the first electrode 21 and the second electrode 22.

A light-emitting device according to an aspect of the present disclosure includes: an organic light-emitting element; and a control unit that controls the organic light-emitting element. The organic light-emitting element includes a first electrode, a second electrode, and an organic light-emitting layer which is disposed between the first electrode and the second electrode and in which separation of charges occurs due to incidence of excited light. The control unit changes a potential difference between the first electrode and the second electrode so that recoupling of the charges occurs, in a second period after passage of a delay period from a first period in which the excited light is incident to the organic light-emitting layer.

In the light-emitting device, the organic light-emitting layer in which separation of charges occurs due to incidence of the excited light is used, and the potential difference between the first electrode and the second electrode is changed so that recoupling of the charges occurs in the second period after passage of the delay period from the first period in which the excited light is incident to the organic light-emitting layer. According to this, light emission can be obtained from the organic light-emitting layer in the second period after passage of the delay period from the first period in which the excited light is incident to the organic light-emitting layer. In this manner, according to the light-emitting device, a new light-emitting form can be realized.

In the light-emitting device according to the aspect of the present disclosure, the control unit may set the potential difference between the first electrode and the second electrode to 0 in the first period and the delay period, and may apply a voltage between the first electrode and the second electrode so that a forward electric field to cause recoupling of the charges occurs in the organic light-emitting layer, in the second period. According to this, light emission can be obtained from the organic light-emitting layer in the second period with a simple voltage application method.

In the light-emitting device according to the aspect of the present disclosure, the control unit may apply a voltage between the first electrode and the second electrode so that an electric field in a direction opposite to a forward electric field to cause recoupling of the charges occurs in the organic light-emitting layer, in the first period and the delay period, and may apply a voltage between the first electrode and the second electrode so that the forward electric field occurs in the organic light-emitting layer in the second period. According to this, light emission can be obtained from the organic light-emitting layer in the second period with a simple voltage application method.

In the light-emitting device according to the aspect of the present disclosure, the control unit may be capable of adjusting a length of the delay period. According to this, it is possible to adjust timing at which light is emitted from the organic light-emitting layer to the outside.

The light-emitting device according to the aspect of the present disclosure may further include a light source that emits the excited light. The control unit may control the light source so that the excited light is incident to the organic light-emitting layer in the first period. According to this, it is possible to adjust timing at which excited light is incident from the outside to the organic light-emitting layer.

In the light-emitting device according to the aspect of the present disclosure, dipole moment of organic light emitters included in the organic light-emitting layer may be greater than 0 D. According to this, for example, in a case where the potential difference between the first electrode and the second electrode is set to 0 in the first period and the delay period, and a voltage is applied between the first electrode and the second electrode so that the forward electric field to cause recoupling of charges occurs, in the organic light-emitting layer in the second period, even when the delay period is lengthened, sufficient light emission can be obtained from the organic light-emitting layer.

In the light-emitting device according to the aspect of the present disclosure, the dipole moment of the organic light emitters may be 3 D or greater. According to this, for example, in a case where the potential difference between the first electrode and the second electrode is set to 0 in the first period and the delay period, and a voltage is applied between the first electrode and the second electrode so that the forward electric field to cause recoupling of charges occurs in the organic light-emitting layer, in the second period, even when the delay period is lengthened, more sufficient light emission can be obtained from the organic light-emitting layer.

In the light-emitting device according to the aspect of the present disclosure, the dipole moment of the organic light emitters may be 10 D or greater. According to this, for example, in a case where the potential difference between the first electrode and the second electrode is set to 0 in the first period and the delay period, and a voltage is applied between the first electrode and the second electrode so that the forward electric field to cause recoupling of charges occurs in the organic light-emitting layer, in the second period, even when the delay period is lengthened, more sufficient light emission can be obtained from the organic light-emitting layer.

According to another aspect of the present disclosure, there is provided a light-emitting method using an organic light-emitting element including a first electrode, a second electrode, and an organic light-emitting layer which is disposed between the first electrode and the second electrode and in which separation of charges occurs due to incidence of excited light. The method includes: a step in which the excited light is incident to the organic light-emitting layer in a first period; and a step of changing a potential difference between the first electrode and the second electrode so that recoupling of the charges occurs, in a second period after passage of a delay period from the first period.

In the light-emitting method, the organic light-emitting layer in which separation of charges occurs due to incidence of the excited light is used, and the potential difference between the first electrode and the second electrode is changed so that recoupling of the charges occurs in the second period after passage of the delay period from the first period in which the excited light is incident to the organic light-emitting layer. According to this, light emission can be obtained from the organic light-emitting layer in the second period after passage of the delay period from the first period in which the excited light is incident to the organic light-emitting layer. In this manner, according to the light-emitting method, a new light-emitting form can be realized.

According to still another aspect of the present disclosure, there is provided an organic light-emitting element including: a first electrode; a second electrode; an organic light-emitting layer which is disposed between the first electrode and the second electrode and in which separation of charges occurs due to incidence of excited light; and a charge inflow blocking layer that is disposed at least one of between the first electrode and the organic light-emitting layer and between the second electrode and the organic light-emitting layer.

In the organic light-emitting element, when separation of charges occurs in the organic light-emitting layer due to incidence of excited light, reduction of the separated charges due to inflow of charges from at least one of the first electrode and the second electrode to the organic light-emitting layer is suppressed by the charge inflow blocking layer. Accordingly, when the potential difference between the first electrode and the second electrode is changed so that recoupling of charges occurs in a second period after passage of a delay period from a first period in which the excited light is incident to the organic light-emitting layer, light emission can be obtained from the organic light-emitting layer in the second period. In this manner, according to the organic light-emitting element, a new light-emitting form can be realized.

In the organic light-emitting element according to the aspect of the present disclosure, work function of the second electrode may be smaller than work function of the first electrode, and the charge inflow blocking layer may be disposed at least between the second electrode and the organic light-emitting layer. According to this, light emission can be reliably obtained from the organic light-emitting layer in the second period.

In the organic light-emitting element according to the aspect of the present disclosure, the charge inflow blocking layer may be disposed both between the first electrode and the organic light-emitting layer and between the second electrode and the organic light-emitting layer. According to this, light emission can be more reliably obtained from the organic light-emitting layer in the second period.

In the organic light-emitting element according to the aspect of the present disclosure, the first electrode, and the charge inflow blocking layer disposed between the first electrode and the organic light-emitting layer may have a light-transmitting property with respect to the excited light incident to the organic light-emitting layer and light emitted from the organic light-emitting layer. According to this, it is possible to cause the excited light to be reliably incident to the organic light-emitting layer and to cause light to be reliably emitted from the organic light-emitting layer.

In the organic light-emitting element according to the aspect of the present disclosure, work function of the second electrode may be smaller than work function of the first electrode, the charge inflow blocking layer may be disposed both between the first electrode and the organic light-emitting layer and between the second electrode and the organic light-emitting layer, the charge inflow blocking layer disposed between the first electrode and the organic light-emitting layer may have a HOMO level deeper than a HOMO level of organic light emitters included in the organic light-emitting layer, and the charge inflow blocking layer disposed between the second electrode and the organic light-emitting layer may have a LUMO level shallower than a LUMO level of the organic light emitters. According to this, in the first period and the delay period, flowing-out of holes from the organic light-emitting layer to the first electrode can be prevented, and flowing-out of electrons from the organic light-emitting layer to the second electrode can be prevented, and thus light emission can be more reliably obtained from the organic light-emitting layer in the second period.

In the organic light-emitting element according to the aspect of the present disclosure, work function of the second electrode may be smaller than work function of the first electrode, and the charge inflow blocking layer disposed at least one of between the first electrode and the organic light-emitting layer and between the second electrode and the organic light-emitting layer may have a HOMO level deeper than a HOMO level of organic light emitters included in the organic light-emitting layer. According to this, in the first period and the delay period, flowing-out of holes from the organic light-emitting layer to the outside can be prevented, and thus light emission can be more reliably obtained from the organic light-emitting layer in the second period.

In the organic light-emitting element according to the aspect of the present disclosure, work function of the second electrode may be smaller than work function of the first electrode, and the charge inflow blocking layer disposed at least one of between the first electrode and the organic light-emitting layer and between the second electrode and the organic light-emitting layer may have a LUMO level shallower than a LUMO level of organic light emitters included in the organic light-emitting layer. According to this, in the first period and the delay period, flowing-out of electrons from the organic light-emitting layer to the outside can be prevented, and thus light emission can be more reliably obtained from the organic light-emitting layer in the second period.

In the organic light-emitting element according to the aspect of the present disclosure, dipole moment of organic light emitters included in the organic light-emitting layer may be greater than 0 D. According to this, for example, in a case where the potential difference between the first electrode and the second electrode is set to 0 in the first period and the delay period, and a voltage is applied between the first electrode and the second electrode so that the forward electric field to cause recoupling of charges occurs in the organic light-emitting layer, in the second period, even when the delay period is lengthened, sufficient light emission can be obtained from the organic light-emitting layer.

In the organic light-emitting element according to the aspect of the present disclosure, the dipole moment of the organic light emitters may be 3 D or greater. According to this, for example, in a case where the potential difference between the first electrode and the second electrode is set to 0 in the first period and the delay period, and a voltage is applied between the first electrode and the second electrode so that the forward electric field to cause recoupling of charges occurs in the organic light-emitting layer, in the second period, even when the delay period is lengthened, more sufficient light emission can be obtained from the organic light-emitting layer.

In the organic light-emitting element according to the aspect of the present disclosure, the dipole moment of the organic light emitters may be 10 D or greater. According to this, for example, in a case where the potential difference between the first electrode and the second electrode is set to 0 in the first period and the delay period, and a voltage is applied between the first electrode and the second electrode so that the forward electric field to cause recoupling of charges occurs in the organic light-emitting layer, in the second period, even when the delay period is lengthened, more sufficient light emission can be obtained from the organic light-emitting layer.

According to the present disclosure, it is possible to provide a light-emitting device, a light-emitting method, and an organic light-emitting element which are capable of realizing a new light-emitting form.

What is claimed is:
1. An organic light-emitting element comprising:
   a first electrode that functions as a positive electrode;
   a second electrode that functions as a negative electrode;
   an organic light-emitting layer which is disposed between the first electrode and the second electrode and which is configured so that separation of charges occurs due to incidence of excited light therein; and
   at least one of a charge inflow blocking layer that is disposed between the first electrode and the organic light-emitting layer and blocks inflow of holes from the first electrode to the organic light-emitting layer, and a charge inflow blocking layer that is disposed between the second electrode and the organic light-emitting layer and blocks inflow of electrons from the second electrode to the organic light-emitting layer, wherein the charge inflow blocking layer disposed between the first electrode and the organic light-emitting layer has a HOMO level deeper than a HOMO level of organic light emitters included in the organic light-emitting layer, the charge inflow blocking layer disposed between the second electrode and the organic light-emitting layer has a LUMO level shallower than a LUMO level of the organic light emitters, and a dipole moment of the organic light emitters is 3 D or greater.

2. The organic light-emitting element according to claim 1, comprising the charge inflow blocking layer that is disposed between the second electrode and the organic light-emitting layer, wherein work function of the second electrode is smaller than work function of the first electrode.

3. The organic light-emitting element according to claim 1, comprising the charge inflow blocking layer that is disposed between the first electrode and the organic light-emitting layer and the charge inflow blocking layer that is disposed between the second electrode and the organic light-emitting layer.

4. The organic light-emitting element according to claim 3, wherein the first electrode, and the charge inflow blocking layer disposed between the first electrode and the organic light-emitting layer have a light-transmitting property with respect to the excited light incident to the organic light-emitting layer and light emitted from the organic light-emitting layer.

5. The organic light-emitting element according to claim 1, comprising the charge inflow blocking layer that is disposed between the first electrode and the organic light-emitting layer and the charge inflow blocking layer that is disposed between the second electrode and the organic light-emitting layer, wherein work function of the second electrode is smaller than work function of the first electrode.

6. The organic light-emitting element according to claim 1, wherein work function of the second electrode is smaller than work function of the first electrode.

7. The organic light-emitting element according to claim 1, wherein the dipole moment of the organic light emitters is 10 D or greater.

* * * * *